United States Patent
Kim et al.

(10) Patent No.: US 11,980,067 B2
(45) Date of Patent: May 7, 2024

(54) TRANSPARENT DISPLAY PANEL AND TRANSPARENT DISPLAY DEVICE INCLUDING THE SAME

(71) Applicant: LG Display Co., Ltd., Seoul (KR)

(72) Inventors: Euitae Kim, Paju-si (KR); Changsoo Kim, Paju-si (KR); Kiseob Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 150 days.

(21) Appl. No.: 17/091,973

(22) Filed: Nov. 6, 2020

(65) Prior Publication Data
US 2021/0143244 A1    May 13, 2021

(30) Foreign Application Priority Data
Nov. 13, 2019  (KR) .................. 10-2019-0144861

(51) Int. Cl.
*H10K 59/35*      (2023.01)
*H10K 59/131*     (2023.01)
*H10K 59/30*      (2023.01)
*H10K 59/88*      (2023.01)

(52) U.S. Cl.
CPC .......... *H10K 59/131* (2023.02); *H10K 59/30* (2023.02); *H10K 59/352* (2023.02); *H10K 59/88* (2023.02)

(58) Field of Classification Search
CPC ... H01L 27/3216–3218; H01L 27/3276; H01L 27/3206; H01L 27/3223; G09G 3/3233; G09G 2300/0426; H10K 59/30; H10K 59/351–353
See application file for complete search history.

(56) References Cited

U.S. PATENT DOCUMENTS

| | | |
|---|---|---|
| 9,892,672 B2 | 2/2018 | Lee et al. |
| 2002/0167016 A1* | 11/2002 | Hoelen ................ G02B 6/0068 257/89 |
| 2016/0079323 A1* | 3/2016 | Choi .................. H01L 27/3246 257/40 |
| 2016/0321982 A1* | 11/2016 | Lee ....................... G09G 3/2003 |
| 2017/0287988 A1* | 10/2017 | Lee ........................ H10K 50/19 |
| 2018/0175121 A1* | 6/2018 | Ji ........................... H10K 50/80 |
| 2019/0326365 A1* | 10/2019 | Jin ....................... H10K 59/352 |
| 2021/0036090 A1* | 2/2021 | Hong .................. H01L 27/3218 |
| 2021/0043706 A1* | 2/2021 | Kobayashi ............. H01L 51/56 |

FOREIGN PATENT DOCUMENTS

KR    10-2016-0128490 A    11/2016

* cited by examiner

*Primary Examiner* — Eric K Ashbahian
(74) *Attorney, Agent, or Firm* — Seed IP Law Group LLP

(57) ABSTRACT

A transparent display panel and a transparent display device including the same are disclosed. A transparent display panel includes a substrate having a display region including a plurality of light-emitting regions and a plurality of transmissive regions; and a plurality of line regions disposed over the substrate and extending across the display region, wherein an outer contour of each of the transmissive regions is at least partially curved or wherein each of the transmissive regions has a polygonal shape, and all internal angles of the polygon shape are obtuse. Thus, parallel regularity and periodicity of array of transmissive regions are avoided wherein a haze value is reduced by reducing or minimizing occurrence of light diffraction, and thus, clarity or visibility of an image is improved.

15 Claims, 40 Drawing Sheets

Haze 2.76%

Haze 2.03%

Haze 1.33%

TRANSPARENT DISPLAY PANEL AND TRANSPARENT DISPLAY DEVICE INCLUDING THE SAME

CROSS-REFERENCE TO RELATED APPLICATIONS

This application claims the priority of Korean Patent Application No. 10-2019-0144861 filed on Nov. 13, 2019, in the Korean Intellectual Property Office, the disclosure of which is hereby incorporated by reference in its entirety.

BACKGROUND

Technical Field

The present disclosure relates to a transparent display panel including a pixel structure that allows reducing or minimizing diffraction by an external light source and makes the most of a light-emitting region, and a transparent display device including the panel.

Description of the Related Art

A display device that displays various information using an image includes a liquid crystal display device (LCD), and an organic light emitting diode based display device (OLED).

As an image implementation skill is advanced, in recent years, a demand for a transparent display device in which at least a partial region on which information is displayed is transparent to transmits light so that an object or a background behind the display device is visible to a user in front of the device has increased.

The transparent display device transmits light in front and rear directions. Thus, the device may display information in the front and rear directions of the display device, such that front and rear users in front and rear of the display device may see objects or backgrounds opposite thereto respectively.

For example, the transparent display device implemented as an organic light-emitting display device may include a transparent region that transmits incident light as it is and a light-emitting region that emits light.

BRIEF SUMMARY

The transparent display device has a pixel structure in which a plurality of transmissive regions are arranged in a regular periodical manner. Thus, diffraction of light may occur in the device due to dual nature of light having both particle and wave characteristics.

In particular, when the diffraction phenomenon of light occurs in the transparent display device, a haze value is increased, so that clarity or visibility of the transparent display device may be reduced.

Accordingly, the inventors of the present disclosure have invented a transparent display panel including a pixel structure that allow reducing or minimizing the diffraction by an external light source and makes the most of a light-emitting region, and a transparent display device including the same.

One or more embodiments of the present disclosure provides a transparent display panel in which parallel regularity and periodicity of transmissive regions are avoided to reduce or minimize the diffraction of light, and a transparent display device including the same.

Further, one or more embodiments of the present disclosure provides a transparent display panel in which not only an increased transmission region is secured, but also a design of a pixel including a light-emitting region and a circuit line region is facilitated, and a transparent display device including the same.

The technical benefits of the present disclosure are not limited to the above-mentioned benefits. Other advantages of the present disclosure, as not mentioned above, may be understood from the following descriptions and more clearly understood from the embodiments of the present disclosure. Further, it will be readily appreciated that the advantages of the present disclosure may be realized by features and combinations thereof as disclosed in the claims.

A transparent display panel according to an embodiment of the present disclosure includes a substrate having a display region including a plurality of light-emitting regions and a plurality of transmissive regions, and a plurality of line regions disposed over the substrate and extending across the display region, wherein an outer contour of each of the transmissive regions is at least partially curved.

Further, a transparent display panel according to an embodiment of the present disclosure includes a substrate having a display region including a plurality of light-emitting regions and a plurality of transmissive regions, and a plurality of line regions disposed over the substrate and extending across the display region, wherein each of the transmissive regions has a polygon shape whose all internal angles are obtuse.

In this case, the light-emitting regions may include a first color light-emitting region, a second color light-emitting region, and a third color light-emitting region. The second color light-emitting region and the third color light-emitting region may be disposed on corresponding line regions, respectively. The first color light-emitting region may be disposed between the second color light-emitting region and the third color light-emitting region.

Accordingly, the transparent display panel and the transparent display device according to the present disclosure may avoid the parallel regularity and periodicity of the transmissive regions, thereby to reduce or minimize the diffraction phenomenon of light, and to facilitate the design of the pixel including the light-emitting region and the design of the line region.

According to the present disclosure, the haze value may be reduced by avoiding the parallel regularity and periodicity of the arrangement of the transmissive regions to reduce or minimize the occurrence of light diffraction. Thus, the clarity or visibility of the transparent display device may be improved.

Further, according to the present disclosure, the design of the pixel including the light-emitting region and the design of the line region may be facilitated using a pixel structure in which some of light-emitting regions are disposed on the line regions respectively, based on the arrangement structure of the transmissive regions that reduce or minimize the occurrence of diffraction of light.

Further specific effects of the present disclosure as well as the effects as described above will be described in connection with illustrations of specific details for carrying out the present disclosure.

DETAILED DESCRIPTION

Figure 1:
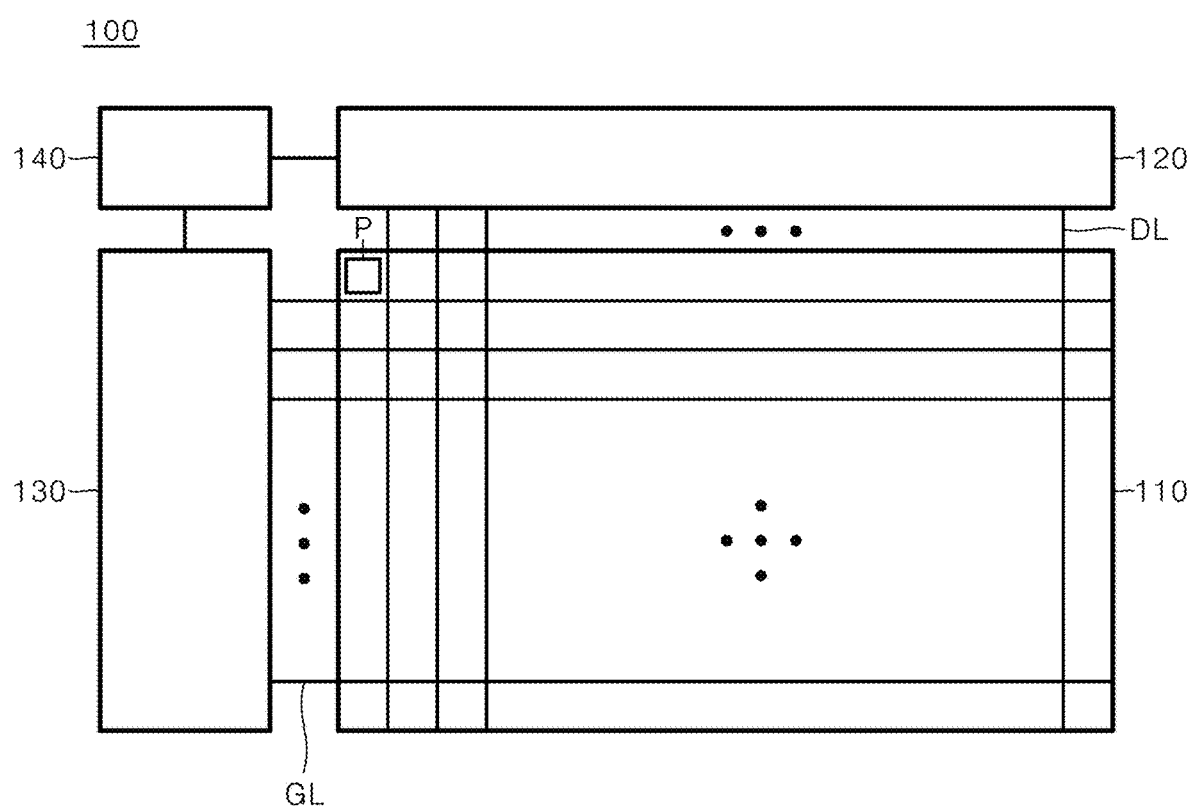
FIG. 1 is a block diagram schematically illustrating a system of a transparent display device.

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a transparent display panel according to some embodiments of the present disclosure and a transparent display device including the same will be exemplified.

Figure 2:
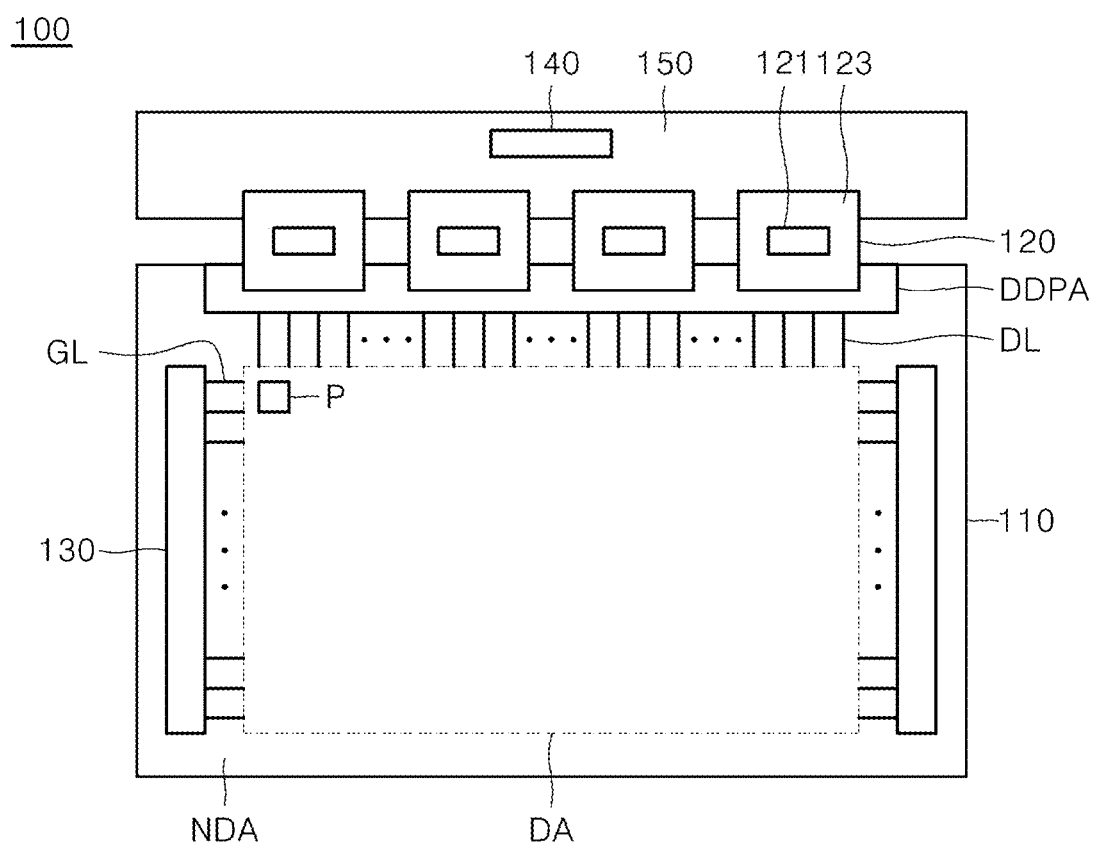
FIG. 2 is a plan view for schematically illustrating connection and arrangement relationships of components constituting a transparent display device.

FIG. 1 is a block diagram for schematically illustrating a transparent display device according to an embodiment of the present disclosure. FIG. 2 is a plan view for schematically illustrating connection and arrangement relationships of components constituting a transparent display device.

However, each of FIG. 1 and FIG. 2 is one embodiment according to the present disclosure. Thus, the connection and arrangement relationships of the components of the transparent display device 100 according to the present disclosure are not limited thereto.

The transparent display device 100 may include a transparent display panel 110, a timing controller 140, a data driver 120, and a gate driver 130.

The transparent display panel 110 may include a display region DA containing at least one pixel P to display an image, and a non-display region NDA in which an image is not displayed.

The non-display region NDA may be disposed to surround the display region DA.

In the non-display region NDA, the gate driver 130, a data drive IC pad DDPA, and various lines may be disposed. The non-display region NDA may correspond to a bezel.

The transparent region of the transparent display panel 110 may be contained in both the display region DA and the non-display region NDA.

The transparent display panel 110 may include a plurality of pixel regions defined by a plurality of gate lines GL extending in a first direction, and a plurality of data lines DL extending in a second direction orthogonal to the gate lines GL.

The pixel regions may be arranged in a matrix form. Each pixel region may include a pixel P composed of at least one sub-pixel SP.

The gate driver 130 is directly stacked on the transparent display panel 110 in a form of GIP (Gate In Panel).

A plurality of GIP circuit regions may be arranged in the GIP form and may be disposed in left and right portions of the non-display region NDA respectively adjacent to left and right outer peripheral portions of the display region DA while the display region DA is interposed between the left and right portions of the non-display region NDA.

The data driver 120 may include at least one source driver integrated circuit 121 (source driver IC) to drive a plurality of data lines DL.

For example, a source driving chip corresponding to each source driver integrated circuit 121 may be mounted on a flexible film 123. One end of the flexible film 123 may be bonded to at least one control printed circuit board 150, while the other end thereof may be bonded to a data drive IC pad (DDPA) of the transparent display panel 110.

The timing controller 140 may be disposed on the control printed circuit board 150. Further, a power controller may be further disposed on the control printed circuit board 150.

In addition, a source printed circuit board may be disposed between the flexible film 123 and the control printed circuit board 150 while the source printed circuit board is connected thereto via a connection medium such as a flexible flat cable (FFC) or a flexible printed circuit (FPC).

In one example, the transparent display device 100 may be embodied as a liquid crystal display device, an organic light-emitting display device, etc. However, the present disclosure is not limited thereto. Hereinafter, in accordance with an embodiment of the present disclosure, an example in which the transparent display device 100 may be embodied as an organic light-emitting display device will be described with reference to FIG. 3 and FIG. 4.

The transparent display panel may include a first substrate 200 and a second substrate 270.

The first substrate 200 may act as a base substrate including a display region DA in which pixels are disposed, and a non-display region NDA.

The second substrate 270 may be opposite to the first substrate 200 and may act as an encapsulating substrate.

Each of the first substrate 200 and the second substrate 270 may be embodied as a plastic substrate or a glass substrate.

The display region DA of the first substrate 200 includes a light-emitting region EA and a transmissive region TA.

A plurality of sub-pixels may be arranged in the light-emitting region EA.

Each sub-pixel may be a red sub-pixel emitting red light, or may be a green sub-pixel emitting green light, or may be a blue sub-pixel emitting blue light, or may be a sub-pixel emitting light, for example, white light other than the red, green or blue light.

Each sub-pixel may include a light-emitting region EA for emitting light of a corresponding color, and a circuit region electrically connected to the light-emitting region EA to control light-emission from the light-emitting region EA.

The light-emitting region of the sub-pixel EA may refer to a region in which light of a corresponding color to each sub-pixel is emitted or may refer to a pixel electrode such as an anode electrode that exists in each sub-pixel, or may mean a region where the pixel electrode is disposed.

The light-emitting region EA includes an organic light-emitting element 220 including an anode electrode as a first electrode 221, an organic light-emitting layer 223, and a cathode electrode as a second electrode 225. The organic light-emitting element 220 emits light at a predefined brightness using a voltage supplied to the first electrode 221 and a voltage supplied to the second electrode 225.

In this case, the second electrode 225 as a transparent electrode may extend across both the light-emitting region EA and the transmissive region TA.

The circuit region of the sub-pixel means a circuit region including the driving thin-film transistor 210 that supplies a voltage or a current to the pixel electrode of each sub-pixel to control light emission from the light-emitting region EA or may mean a region in which the circuit region is disposed.

The driving thin-film transistor 210 includes a gate electrode 214, a source electrode 217a, a drain electrode 217b and an active layer 212.

When the circuit region receives a gate signal from the gate line GL using the thin-film transistors, the circuit region may supply a predefined voltage to the first electrode 221 of the organic light-emitting element 220 of the light-emitting region EA based on a data voltage of the data line DL.

The circuit region may vertically at least partially overlap the light-emitting region EA, but may be disposed at an opposite side to a side from which light is emitted so as not to interfere with the light emission.

An encapsulating layer 250 is formed on the organic light-emitting element 220, specifically, the second electrode 225 thereof. A color filter 260 corresponding to the organic light-emitting element 220 may be formed on the encapsulating layer 250.

The color filter 260 may have the same color as or a different color from that of a corresponding sub-pixel.

The transmissive region TA refers to a region that transmits incident light, and may be a region excluding the circuit region. A transmittance of the transparent display device depends on an area of the transmissive region TA.

Figure 3:
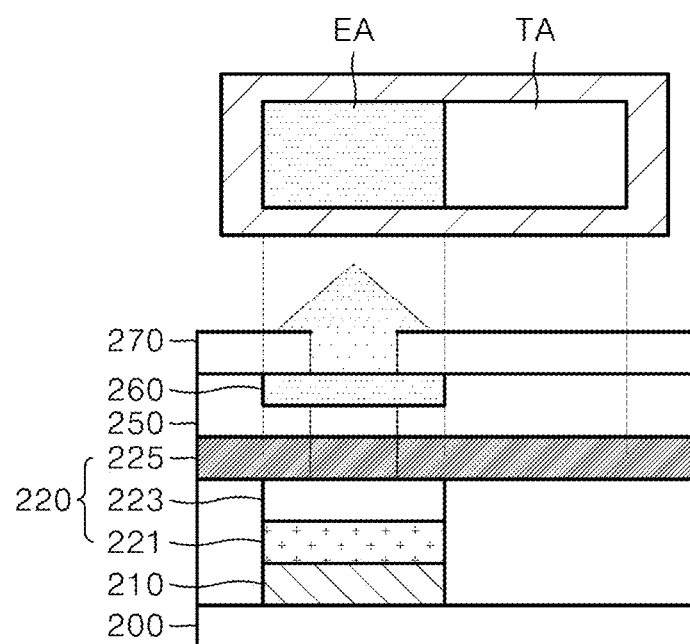
FIG. 3 is a schematic cross-sectional view of light-emitting and transmissive regions of a pixel in an organic light-emitting display panel.
Figure 4:
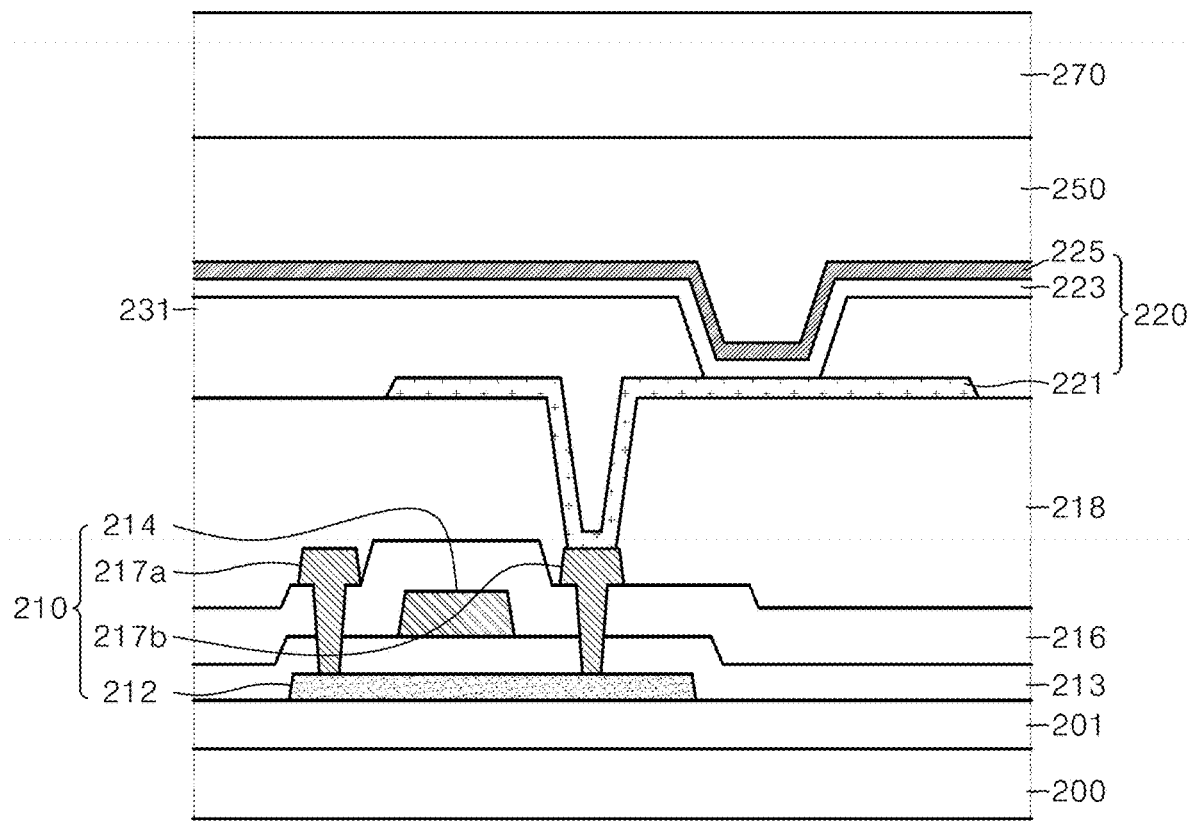
FIG. 4 is a more detailed cross-sectional view of a light-emitting region of a pixel in an organic light-emitting display panel.

FIG. 3 shows one embodiment of the present disclosure in which the light-emitting region EA and the transmissive region TA corresponds to one sub-pixel. However, the present disclosure is not limited thereto. The arrangement form of the light-emitting region EA and the transmissive region TA of the transparent display device according to the present disclosure is not limited thereto. FIG. 4 is a more detailed cross-sectional view of a light-emitting region EA corresponding to one sub-pixel in an organic light-emitting display device according to an embodiment of the present disclosure.

Over the first substrate 200, a driving thin-film transistor 210, and an organic light-emitting element 220 are disposed.

A passivation layer 218 may be formed on the driving thin-film transistor 210 to cover the driving thin-film transistor 210. A contact-hole exposing a drain electrode 217b may be formed in the passivation layer 218.

The passivation layer 218 may act as a planarization layer made of an organic insulating material. In some embodiments, a buffer layer 201 may be formed on the first substrate 200, and a gate insulation layer 213 may be formed on the active layer 213, and an interlayer insulation layer 216 may be formed on the gate electrode 214.

The first electrode 221 constituting the organic light-emitting element 220 is formed on the passivation layer 218. The first electrode 221 is electrically connected to the drain electrode 217b via the contact-hole defined in the passivation layer 218. Thus, the driving thin-film transistor 210 and the first electrode 221 may be electrically connected to each other.

The first electrode 221 may act as an anode electrode that serves to inject holes. In this case, the first electrode may be embodied as a transparent electrode made of at least one transparent conductive material such as indium tin oxide (ITO), antimony tin oxide (ATO), and indium zinc oxide (IZO).

A bank layer 231 is formed on and over the passivation layer 218. Sub-pixels may be separated from each other via the bank layer 231 to form a border between adjacent light-emitting region EAs to render corresponding colors respectively. The bank layer 231 may have a bank-hole defined therein corresponding to a sub-pixel region to partially expose the first electrode 221.

The organic light-emitting layer 223 may be formed on a top face of the bank layer 231 and on a top face of a portion of the first electrode 221 exposed through the bank-hole. A region where the organic light-emitting layer 223 contacts the first electrode 221 may correspond to a sub-pixel region, more specifically, the light-emitting region EA.

The organic light-emitting layer 223 may include a hole injection layer (HIL), a hole transport layer (HTL), a light-emitting layer (EML), an electron transport layer (ETL), an electron injection layer (EIL).

The light-emitting layer (EML) may emit red R, green G or blue B light and may be made of a phosphorescent material or a fluorescent material that emits a corresponding color.

In this case, each of the hole injection layer (HIL), the hole transport layer (HTL), the electron transport layer (ETL), and the electron injection layer (EIL) may occupy an entire display region. The light-emitting layer EML may be patterned to correspond to each color region, specifically, the first electrode 221. Further, each of the hole injection layer (HIL), the hole transport layer (HTL), the electron transport layer (ETL), and the electron injection layer (EIL) may be patterned to correspond to each color region, specifically, the first electrode 221.

The second electrode 225 is formed on the organic light-emitting layer 223 and over an entirety of the first substrate 200. The second electrode 225 is disposed over an entirety of the display region DA of the first substrate 200. In this case, the second electrode 225 may be disposed over an entirety of the display region DA except for the transmissive region TA.

The second electrode 225 may act as a cathode electrode that serves to inject electrons.

In this case, the second electrode 225 may include at least one of materials such as Ca, Al: Li, Mg: Ag, and Ag. Further, the second electrode 225 may be embodied as a transparent electrode made of at least one of transparent conductive materials such as indium tin oxide (ITO), antimony tin oxide (ATO), and indium zinc oxide (IZO).

On the organic light-emitting element 220, an encapsulating layer 250 is formed that prevents external moisture from penetrating the organic light-emitting element 220.

On the encapsulating layer 250, the second substrate 270 as the encapsulating substrate opposite to the first substrate 200 may be formed.

In this case, a barrier layer may be formed between the encapsulating layer 250 and the second substrate 270 to more effectively prevent external moisture or oxygen from penetrating the organic light-emitting element 220.

Figure 5:
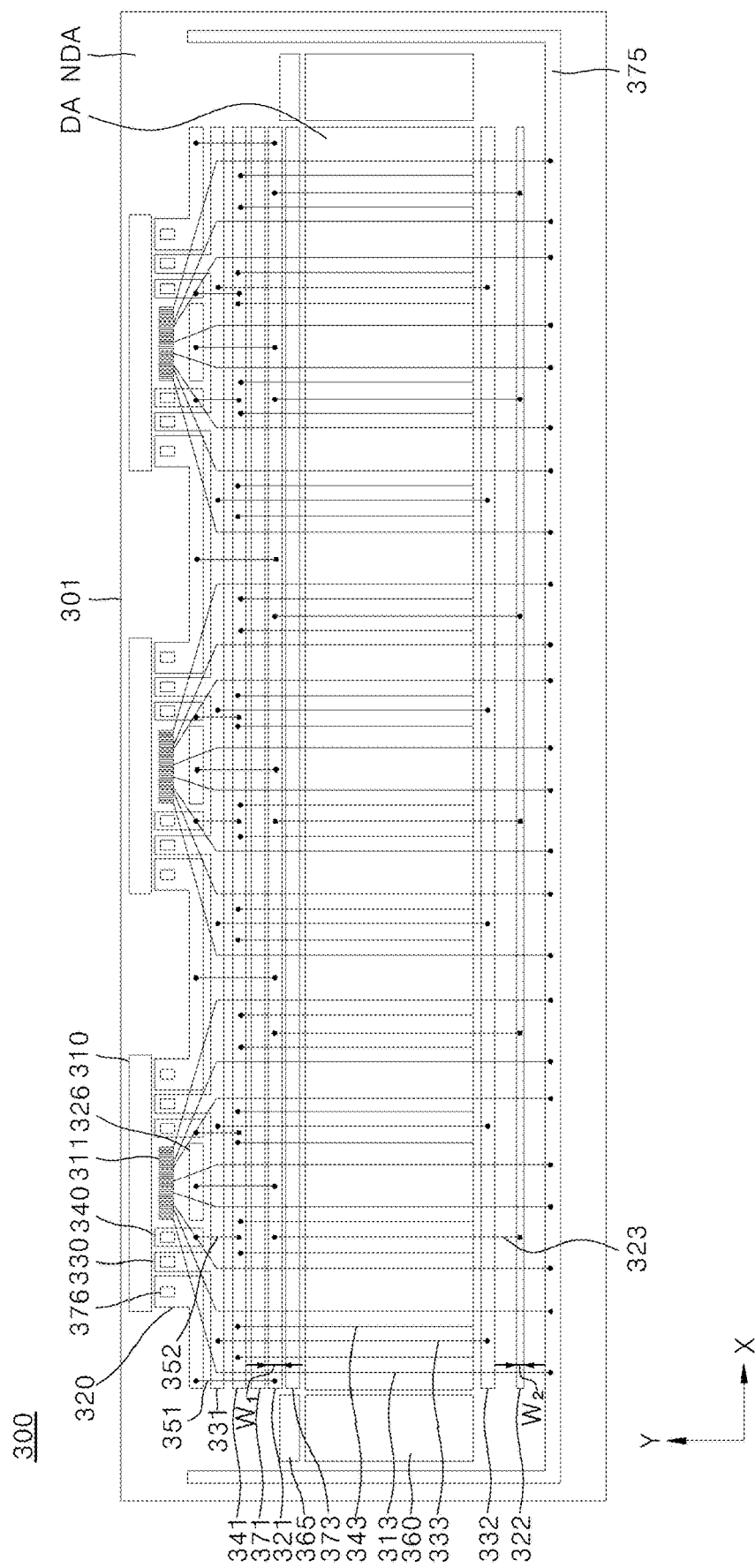
FIG. 5 shows a connection relationship of line connection pads disposed on a first substrate in a transparent display panel according to an embodiment of the present disclosure.

FIG. 5 shows a connection relationship of line connection pads disposed on the first substrate 301 in the transparent display panel 300 according to an embodiment of the present disclosure.

The first substrate 301 includes a display region DA and a non-display region NDA disposed to surround the display region DA. The non-display region NDA may surround top, bottom, left, and right sides of the display region DA. A vertical or up-down direction of the display region DA refers to a Y-axis direction, while a horizontal or left-right direction of the display region DA refers to a X-axis direction.

The display region DA may have a rectangular shape including long sides and short sides.

In this case, the long side is relatively longer than the short side.

Further, the long side means a side parallel to the X-axis direction as the left and right direction of the display region DA.

The short side means a side parallel to the Y-axis direction as the vertical or up-down direction of the display region DA.

The gate driver 130 may be disposed in a form of GIP (gate in panel) and on at least one side to the display region DA.

In other words, a pair of GIP circuit regions 360 are disposed in portions of the non-display region NDA located on the left and right sides to the display region DA respectively.

For example, the GIP circuit region 360 is disposed along the short side of the display region DA. A first VSS voltage line 321 and a second VSS voltage line 322 may be disposed along the long side of the display region DA.

On one portion of the non-display region NDA where the GIP circuit region 360 is disposed, a GIP ESD (electro-static discharge) protection circuit region 365 that operates when static electricity is introduced into the GIP circuit region 360 to reduce or minimize static electricity inflow may be disposed.

At least one data drive IC pad 310 may be disposed on one side to the display region DA where the GIP circuit region 360 is not disposed, for example, at a portion of the non-display region NDA above a top long side of the display region DA.

The data drive IC pad 310 is connected to various lines necessary for driving the transparent display panel 300 such as the power line and the data line.

Between the data drive IC pad 310 and the display region DA, a data line connection pad 311, a reference voltage line connection pad 340, a VSS voltage line connection pad 320, and a VDD voltage line connection pad 330 are disposed to be connected to each other via the data drive IC pad 310 and various lines.

Specifically, each of right and left reference voltage line connection pads 340, each of right and left VDD voltage line connection pads 330, and each of right and left VSS voltage line connection pads 320 may be disposed adjacent to each of right and left portions of the data drive IC pad 310. A spacing between each of right and left reference voltage line connection pads 340 and a length direction center of the data drive IC pad 310 is smaller than a spacing between each of right and left VDD voltage line connection pads 330 and the length direction center of the data drive IC pad 310 which is smaller than a spacing between each of right and left VSS voltage line connection pads 320 and the length direction center of the data drive IC pad 310.

That is, the both reference voltage line connection pads 340, the both VDD voltage line connection pads 330, and the both VSS voltage line connection pads 320 may be arranged symmetrically to each other around a center of the data line connection pad 311. In one or more embodiments, the term "symmetrically" used throughout in the specification is used to include the meaning of both symmetrically and substantially symmetrically.

The reference voltage line connection pad 340, the VDD voltage line connection pad 330, and the VSS voltage line connection pad 320 are arranged to be spaced apart from each other.

The VDD voltage line connection pad 330 may act as a high-level voltage power line connection pad that supplies high-level voltage power to a pixel for driving the pixel, while the VSS voltage line connection pad 320 may act as a low-level voltage power line connection pad that applies low-level voltage power to the pixel for driving the pixel.

The reference voltage line connection pad 340 may supply a reference voltage Vref to a pixel.

A reference voltage line 341 electrically connected to the reference voltage line connection pad 340, a first VDD voltage line 331 electrically connected to the VDD voltage line connection pad 330, and a first VSS voltage line 321 electrically connected to the VSS voltage line connection pad 320 may be disposed between the reference voltage line connection pad 340 and the display region DA, between the VDD voltage line connection pad 330 and the display region DA, and between the VSS voltage line connection pad 320 and the display region DA, respectively.

In one embodiment of the present disclosure, the VDD voltage line connection pad 330 and the first VDD voltage line 331 are integrally formed with each other, the reference voltage line connection pad 340 and the reference voltage line 341 are formed to be spaced apart from each other and electrically connected to each other via a separate connection electrode, and the VSS voltage line connection pad 320 and the first VSS voltage line 321 are formed to be spaced apart from each other and electrically connected to each other via a separate connection electrode. However, the present disclosure is not limited thereto.

The first VDD voltage line 331 may be formed to have a bar shape (e.g.,), and may extend parallel to one side face of the display region DA, specifically, along the long side of the display region DA and may be integrally formed with the VDD voltage line connection pad 330. In one or more embodiments, a bar shape may include a rectangular bar shape, an elongated bar shape or even a bar shape closer to a square bar shape, or any other suitable shape for being implemented in a display device.

Further, the first VDD voltage line 331 may be formed integrally with a plurality of VDD voltage line connection pads 330 corresponding to each data drive IC pad 310 to electrically connect the plurality of VDD voltage line connection pads 330 to each other.

The reference voltage line 341 may be disposed between the first VDD voltage line 331 and the display region DA. In one embodiment of the present disclosure, an example in which the reference voltage line may act as the initial voltage line will be described. However, the present disclosure is not limited thereto. Depending on a compensation circuit region, the reference voltage line 341 may act as a separate line from the initial voltage line.

Thus, the reference voltage line connection pad 340 may be disposed to be spaced apart from the reference voltage line 341 in the Y direction while a spacing between the former and the display region DA is larger than a spacing between the latter and the display region DA.

The reference voltage line 341 may be formed to have a bar shape, and may extend parallel to the first VDD voltage line 331.

In order to apply the reference voltage to the reference voltage line 341, the reference voltage line connection pad 340 and the reference voltage line 341 may be electrically connected to each other via a second connection electrode 352 as a separate connection electrode.

The first VSS voltage line 321 may be disposed between the reference voltage line 341 and the display region DA.

Thus, the VSS voltage line connection pad 320 may be disposed to be spaced apart from the first VSS voltage line 321 in the Y direction while a spacing between the former and the display region DA is larger than a spacing between the latter and the display region DA.

The first VSS voltage line 321 may be formed to have a bar shape and may extend in parallel with the first VDD voltage line 331 and the reference voltage line 341.

In order to apply the VSS voltage to the first VSS voltage line 321, the VSS voltage line connection pad 320 and the first VSS voltage line 321 may be electrically connected to each other via a first connection electrode 351 as a separate connection electrode.

Further, a VSS voltage auxiliary line connection pad 326 as a separate portion from the VSS voltage line connection pad 320 may be disposed between the left and right reference voltage line connection pads 340.

Specifically, the VSS voltage auxiliary line connection pad 326 may have a form of an island spaced from and disposed between the left and right reference voltage line connection pads 340 and spaced from and disposed between the data line connection pad 311 and the VDD voltage line.

The VSS voltage auxiliary line connection pad 326 may be electrically connected to the first VSS voltage line 321 via the first connection electrode 351.

In this way, when the VSS voltage auxiliary line connection pad 326 is electrically connected to the first VSS voltage line 321 via the first connection electrode 351, an entire contact area of the first VSS voltage line 321 is enlarged, thereby to keep a resistance distribution of the first VSS voltage line 321 uniform while lowering an overall resistance thereof.

An ESD protection circuit region 371 may be disposed between the reference voltage line 341 and the display region DA. A multiplexer (MUX) circuit region 373 may be disposed between the first VSS voltage line 321 and the display region DA. However, the present disclosure is not limited thereto. The positions of ESD protection circuit region 371 and MUX circuit region 373 may vary based on a design scheme of the transparent display panel 300. Further, in some embodiments, the MUX circuit region 373 may be disposed between the first VSS voltage line 321 and a dummy pixel pattern region DPA that is adjacent to the display region DA (see FIG. 36).

The ESD protection circuit region 371 may include a plurality of thin-film transistors constituting an ESD protection circuit. When static electricity is generated from the transparent display panel 300, the ESD protection circuit region operates to take out static electricity to an outside.

The MUX circuit region 373 may be configured to include a plurality of thin-film transistors constituting a MUX circuit.

When using the MUX circuit region 373, one channel of a driver IC output may supply a signal to two or more data lines 313. This has an advantage of reducing the number of driver ICs as used.

Each of the ESD protection circuit region 371 and the MUX circuit region 373 may be formed in a bar shape extending parallel to the reference voltage line 341 and the like. However, the present disclosure is not limited thereto.

The first VDD voltage line 331 and the first VSS voltage line 321 may be disposed in an upper portion of the non-display region NDA adjacent to an upper side of the display region DA, while a second VDD voltage line 332 and a second VSS voltage line 322 may be disposed in a lower portion of the non-display region NDA adjacent to a lower side of the display region DA.

The second VDD voltage line 332 and the second VSS voltage line 322 may be spaced from each other while a spacing between the former and the display region DA is smaller than a spacing between the latter and the display region DA.

The second VDD voltage line 332 may be formed to have a bar shape, and may extend in parallel along one side face of the display region DA, specifically, along the long side of the display region DA.

In order to apply the VDD voltage to the second VDD voltage line 332, the first VDD voltage line 331 and the second VDD voltage line 332 may be electrically connected to each other via a separate connection electrode as a VDD voltage connection line 333.

Therefore, using the connection structure as described above, the VDD voltage supplied via the VDD voltage line connection pad 330 may be applied to the second VDD voltage line 332 via the first VDD voltage line 331 and the VDD voltage connection line 333.

In this case, at least one VDD voltage connection line 333 is disposed in the display region DA to extend across the display region DA and thus electrically connects the first VDD voltage line 331 and the second VDD voltage line 332 to each other.

In one example, the second VSS voltage line 322 may be formed to have a bar shape, and may extend in parallel along one side face of the display region DA, specifically, along the long side of the display region DA.

A width $W_2$ of the second VSS voltage line 322 may be smaller than a width $W_1$ of the first VSS voltage line 321, such that the second VSS voltage line 322 is thinner than the first VSS voltage line 321.

In order to apply the VSS voltage to the second VSS voltage line 322, the first VSS voltage line 321 and the second VSS voltage line 322 may be electrically connected to each other via a separate connection electrode as a VSS voltage connection line 323.

Therefore, using the connection structure as described above, the VSS voltage supplied via the VSS voltage line connection pad 320 may be applied to the second VSS voltage line 322 via the first VSS voltage line 321 and the VSS voltage connection line 323.

In this case, at least one VSS voltage connection line 323 may be disposed in the display region DA to extend across the display region DA and thus electrically connects the first VSS voltage line 321 and the second VSS voltage line 322 to each other.

As in one embodiment of the present disclosure, the first VSS voltage line 321 and the second VSS voltage line 322 disposed above and below the display region DA may be electrically connected to each other via at least one VSS voltage connection line 323 extending across the display region DA. Thus, following effects may be realized.

First, non-transparent VSS voltage lines located at left and right portions of the non-display region on the left and right sides to the display region DA may be omitted. Thus, the transparent region of the bezel may be enlarged, so that the transparent region in the bezel may be increased or maximized.

Further, non-transparent VSS voltage lines located at left and right portions of the non-display region on the left and right sides to the display region DA may be omitted. Thus, the VSS voltage line-connection regions required to allow the VSS voltage lines to be placed on bezel portions left and right to the display region DA are not needed. Thus, the bezel may be slim.

For example, when the VSS voltage connection line 323 is disposed in each of left and right portions of the non-display region NDA left and right to the display region DA, the VSS voltage line is disposed to surround the display region DA and extends along an outer periphery of the display region DA. In this case, a size of the transparent region of the bezel is reduced because the non-transparent VSS voltage line is formed in the non-display region NDA out of the outer periphery of the display region DA, thereby to disallow reduction of the bezel area.

However, in the VSS voltage line arrangement structure according to an embodiment of the present disclosure, the VSS voltage lines are not disposed on the top, bottom, left, and right sides to the display region DA, that is, on four side portions of the bezel. Rather, it may suffice that the VSS voltage lines are disposed only in the bezel on the top and bottom sides to the display region DA.

Therefore, according to an embodiment of the present disclosure, an increased transparent region of a bezel where the non-transparent VSS voltage line is not disposed may be secured. When necessary, a size of the bezel may be reduced, so that the bezel may be slimmer.

Further, when the VSS voltage line surrounds the outer periphery of the display region DA, the VSS voltage flows around the outer periphery of the display region DA and flows into the display region DA and then is supplied to the pixels in the display region DA. Thus, the VSS voltage line which serves as a current path must be thick in order to function as the current path in a reliable manner in terms of the electrical resistance.

However, in one embodiment of the present disclosure, while the VSS voltage connection line 323 passes across the display region DA, the VSS voltage connection line may directly supply the VSS voltage to the pixel. Thus, the second VSS voltage line 322 may not serve as a current path.

In this way, when the second VSS voltage line 322 does not serve as the current path, the second VSS voltage line 322 does not need to be formed to be thick in consideration of the electrical resistance and thus be as thin as possible.

Therefore, according to an embodiment of the present disclosure, the second VSS voltage line 322 may have a width smaller than that of the first VSS voltage line 321. Thus, as the width of the second VSS voltage line 322 decreases, a size of a transparent region in a lower bezel portion below the display region DA may be increased. When necessary, the bezel may be made slimmer.

A lighting tester 375 may be disposed in the non-display region NDA and be spaced apart from the second VSS voltage line 322 while a spacing between the former and the display region DA is larger than a spacing between the latter and the display region DA.

The lighting tester 375 may be formed in a bar shape extending parallel to the second VSS voltage line 322, and may further extend along both left and right sides of the display region DA, thereby to surround three sides of the display region DA.

The lighting tester 375 may supply a lighting test signal to a plurality of data lines 313 before a module process after the transparent display panel 300 is manufactured and may inspect a defect of the transparent display panel 300.

The lighting tester 375 includes a plurality of inspection switching elements connected to the plurality of data lines 313 respectively.

Therefore, the plurality of data lines 313 branched from the data line connection pad 311 extend across the display region DA and then are electrically connected to the lighting tester 375.

A lighting test signal applicator 376 may be formed on a partial region of each of the reference voltage line connection pad 340, the VDD voltage line connection pad 330, and the VSS voltage line connection pad 320 to supply the lighting test signal to the lighting tester 375.

FIG. 6 to FIG. 10 are plan views showing, based on an interlayer stacking structure, a connection relationship between the lines of FIG. 5 in the transparent display panel 300 according to an embodiment of the present disclosure.

Figure 6:
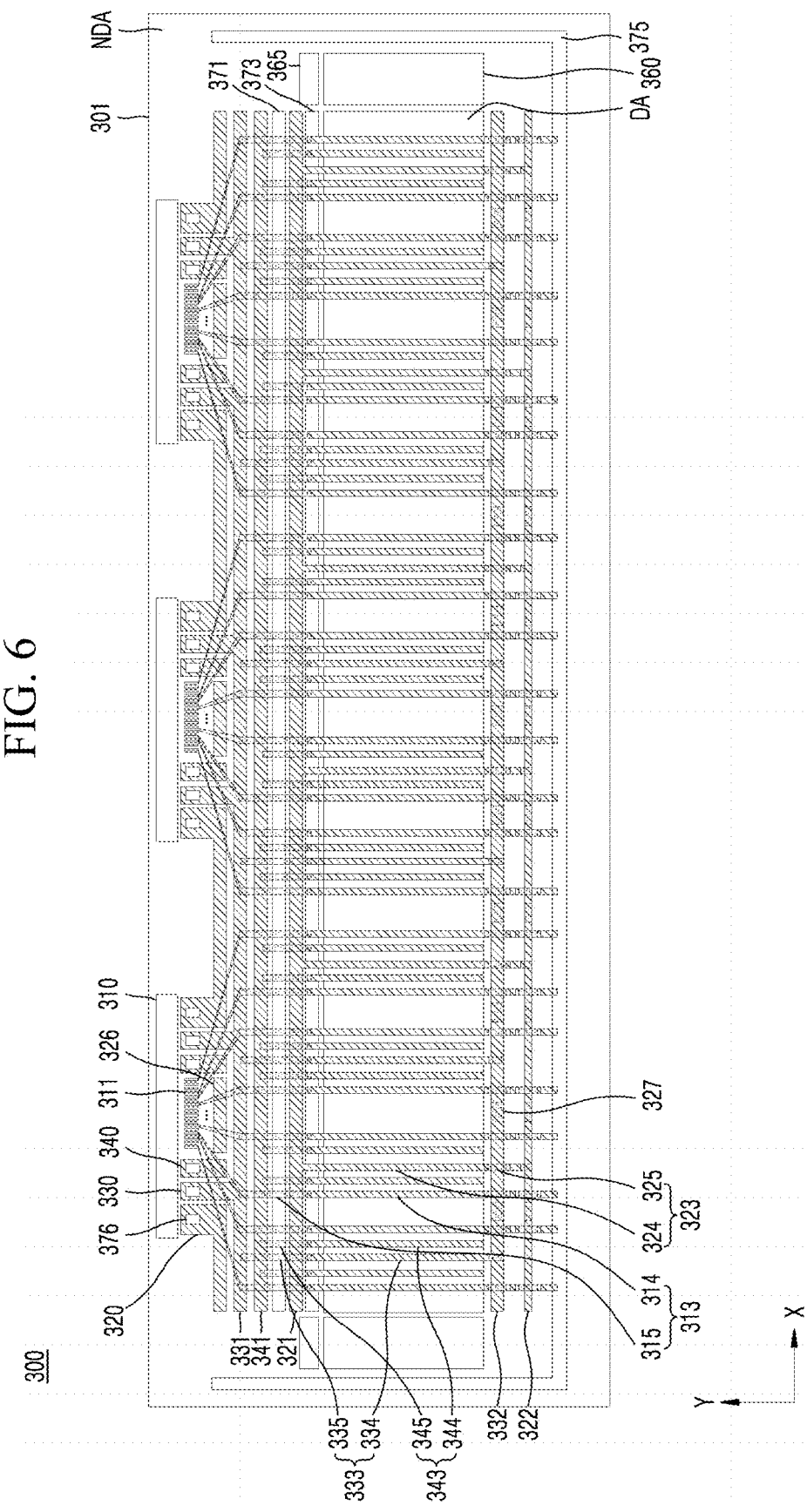
FIG. 6 to FIG. 10 are plan views showing, based on an interlayer stacking structure, a connection relationship between lines of FIG. 5 in the transparent display panel according to an embodiment of the present disclosure.

As shown in FIG. 6, the reference voltage line connection pad 340, the VDD voltage line connection pad 330, the VSS voltage line connection pad 320, the VSS voltage auxiliary line connection pad 326, the reference voltage line 341, the first VDD voltage line 331, the second VDD voltage line 332, the first VSS voltage line 321 and the second VSS voltage line 322 of the transparent display panel 300 according to an embodiment of the present disclosure may constitute the same layer and may be spaced apart from each other. In some embodiments, where appropriate, constitute the same layer means that the elements (or components) are formed of the same layer or are formed on the same layer.

The reference voltage line connection pad 340, the VDD voltage line connection pad 330, the VSS voltage line connection pad 320, the VSS voltage auxiliary line connection pad 326, the reference voltage line 341, the first VDD voltage line 331, the second VDD voltage line 332, the first VSS voltage line 321, the second VSS voltage line 322, the source electrode 217a, and the drain electrode 217b of the driving thin-film transistor 210 of a pixel may be made of the same material and may constitute the same layer.

However, as illustrated above, the VDD voltage line connection pad 330 and the first VDD voltage line 331 may be integrally formed with each other without being separated from each other.

Thus, the line connection pads and the lines constitute the same layer. Thus, the connection electrodes that electrically connect the line connection pads and the lines to each other should not form a short-circuit with other lines between the line connection pad and the line to be connected to each other, or between the lines.

For example, in order to connect the data lines 313 branched from the data line connection pad 311 to the lighting tester 375, the data line 313 may be composed of a first data line 314 and a second data line 315 which constitute different layers and are electrically connected to each other.

In this case, the first data line 314, the source electrode 217a, and drain electrode 217b of the driving thin-film transistor 210 of the pixel may constitute the same layer and may be made of the same material. The second data line 315, and the gate electrode 214 of the driving thin-film transistor 210 of the pixel may constitute the same layer and may be made of the same material.

The data line 313 applies a data signal to pixels in the display region DA. Thus, the first and second data lines 314 and 315 of the data line 313 branched from the data line connection pad 311 may constitute different layers so as not to form a short-circuit with various line connection pads and lines disposed in a region between the display region DA and the data line connection pad 311.

Thus, the second data line 315 may act as the data line 313 in a region between the display region DA and the data line connection pad 311. The first data line 314 constituting a different layer from a layer of the second data line 315 may act as the data line 313 in the display region.

Then, the second data line 315 may act as the data line 313 in a region between the display region DA and the lighting tester 375. Then, the first data line 314 as the data line 313 may be connected to the lighting tester 375.

However, the first data line 314 and the second data line 315 may act as the data line 313 in a repeatedly alternate manner such that the data line 313 does not form a short-circuit with the second VDD voltage line 332 and the second VSS voltage line 322 in regions in which the data line 313 overlaps the second VDD voltage line 332 and the second VSS voltage line 322 in a region between the display region DA and the lighting tester 375.

The data line 313 may change from the first data line 314 to the second data line 315 in a region where the data line 313 does not overlap the second VDD voltage line 332, such that the data line 313 does not form a short-circuit with the second VDD voltage line 332 while extending across the second VDD voltage line 332. In this way, the second data line 315 and the second VDD voltage line 332 do not constitute the same layer, thereby preventing the short circuit therebetween.

Figure 12:
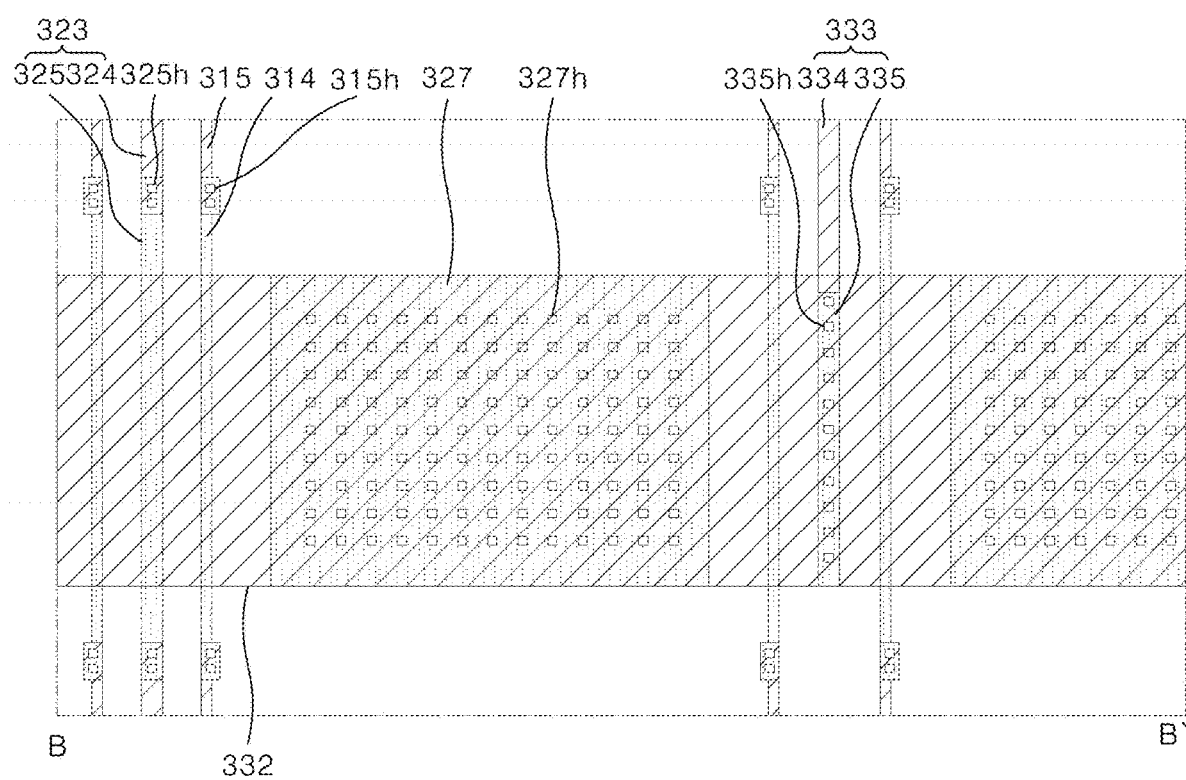
FIG. 12 is an enlarged plan view of a B-B' region of FIG. 11.

In the connection, the data line 313 changing from the first data line 314 to the second data line 315 may mean that, as shown in FIG. 12, the first data line 314 is connected to the second data line 315 via at least one contact-hole such that electrical connection therebetween is maintained, but the first data line 314 and the second data line 315 constitute different layers and are made of the different materials. This principle may be equally applied to other lines as exemplified below.

After the second data line 315 extends across the second VDD voltage line 332, the second data line may be changed back to the first data line 314 in a region where the data line 313 does not overlap the second VDD voltage line 332.

That is, the first data line 314 and the second data line 315 may constitute different layers and are electrically connected to each other via at least one second data line contact-hole 315h.

In the same manner, the reference voltage connection line 343 may be composed of a first reference voltage connection line 344 and a second reference voltage connection line 345 which constitute different layers and are electrically connected to each other.

In this case, the first reference voltage connection line 344, the source electrode 217a and the drain electrode 217b may constitute the same layer and may be made of the same material. The second reference voltage connection line 345 and the gate electrode 214 may constitute the same layer and may be made of the same material.

For example, the reference voltage connection line 343 extends to a lower end of the display region DA. The reference voltage connection line 343 may be composed of the first reference voltage connection line 344 and the second reference voltage connection line 345 which constitute different layers and are electrically connected to each other. The reference voltage connection line 343 extends across the display region DA. A distal end of the reference voltage connection line 343 need not contact a separate line.

Because the reference voltage connection line 343 applies a reference voltage to pixels in the display region DA, the reference voltage connection line 343 is composed of different reference voltage connection lines constituting different layers such that the reference voltage connection line 343 does not form a short-circuit with various line connection pads and lines in a region between the display region DA and the reference voltage line 341.

Thus, the reference voltage connection line 343 is embodied as the second reference voltage connection line 345 in a region between the display region DA and the reference voltage line 341. In the display region DA, the reference voltage connection line 343 is embodied as the first reference voltage connection line 344 which constitutes a different layer from that of the second reference voltage connection line 345.

The first reference voltage connection line 344 and the second reference voltage connection line 345 may constitute different layers and may be electrically connected to each other via at least one contact-hole. Further, the VSS voltage connection line 323 may be composed of a first VSS voltage connection line 324 and a second VSS voltage connection line 325 constituting different layers and being electrically connected to each other.

In this case, the first VSS voltage connection line 324, the source electrode 217a and drain electrode 217b may constitute the same layer and may be made of the same material. The second VSS voltage connection line 325 and the gate electrode 214 may constitute the same layer and may be made of the same material.

For example, in order to connect the VSS voltage connection line 323 to the second VSS voltage line 322, the first VSS voltage connection line 324 and the second VSS voltage connection line 325 constituting different layers are electrically connected to each other.

Since the VSS voltage connection line 323 electrically connects the first VSS voltage line 321 and the second VSS voltage line 322 sandwiching the display regions DA therebetween to each other, the first VSS voltage connection line 324 and the second VSS voltage connection line 325 of the VSS voltage connection line may constitute different layers such that the VSS voltage connection line does not form a short-circuit with various line connection pads and lines in a region between the first VSS voltage line 321 and the second VSS voltage line 322.

In one embodiment of the present disclosure, no other line is disposed between the display region DA and the first VSS voltage line 321. Thus, the VSS voltage connection line 323 extending from the first VSS voltage line 321 may be embodied as the first VSS voltage connection line 324 integrally formed with the first VSS voltage line 321 and made of the same material as that of the first VSS voltage line 321 and constituting the same layer with the first VSS voltage line 321.

The first VSS voltage connection line 324 branched from the first VSS voltage line 321 may extend across the display region DA. Then, when the VSS voltage connection line 323 extends across the second VDD voltage line 332, the first VSS voltage connection line 324 and the second VSS voltage connection line 325 may act as the VSS voltage connection line 323 in a repeatedly alternate manner such that the VSS voltage connection line 323 does not form a short-circuit with the second VDD voltage line 332 in a region where the VSS voltage connection line 323 overlaps the second VDD voltage line 332.

When the VSS voltage connection line 323 extends across the second VDD voltage line 332, the VSS voltage connection line 323 may change from the first VSS voltage connection line 324 to the second VSS voltage connection line 325 in a region where the VSS voltage connection line 323 does not overlap the second VDD voltage line 332. Thus, when the VSS voltage connection line 323 extends across the second VDD voltage line 332, the VSS voltage connection line 323 does not form a short-circuit with the second VDD voltage line 332.

That is, the first VSS voltage connection line 324 and the second VSS voltage connection line 325 constitute different layers and are electrically connected to each other via at least one second VSS voltage connection line contact-hole 325h.

Figure 13:
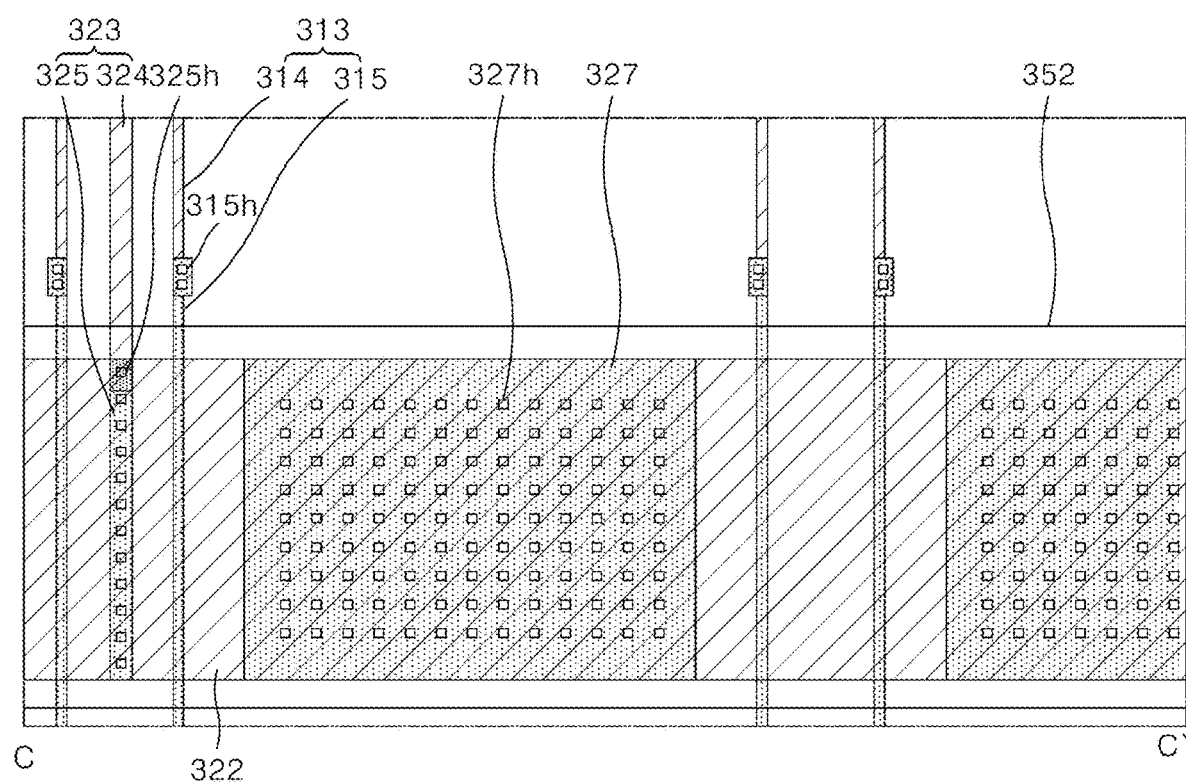
FIG. 13 is an enlarged plan view of a C-C' region of FIG. 11.

After the VSS voltage connection line 323 has extended across the second VDD voltage line 332, the first VSS voltage connection line 324 may be connected to the second VSS voltage line 322, as shown in FIG. 13.

In this case, the first VSS voltage connection line 324 and the second VSS voltage line 322 may be electrically connected to each other via a second VSS voltage connection line 325 connected to the first VSS voltage connection line 324 via at least one second VSS voltage connection line contact-hole 325h.

In addition, in a region where the second VSS voltage line 322 does not overlap the data line 313, auxiliary lines 327 connected to the second VSS voltage line 322 via at least one auxiliary line contact-hole 327h are disposed below the second VSS voltage line 322.

The auxiliary line 327 and the gate electrode 214 may be made of the same material and may constitute the same layer.

The auxiliary line 327 may be connected to a rear face of the second VSS voltage line 322, thereby reducing an overall resistance of the second VSS voltage line 322.

Further, the VDD voltage connection line 333 may be composed of a first VDD voltage connection line 334 and a second VDD voltage connection line 335 constituting different layers and being electrically connected to each other.

In this case, the first VDD voltage connection line 334, the source electrode 217a and drain electrode 217b of the driving thin-film transistor 210 of the pixel may be made of the same material and may constitute the same layer. The second VDD voltage connection line 335 and the gate electrode 214 of the driving thin-film transistor 210 of the pixel may be made of the same material and may constitute the same layer.

For example, in order to connect the VDD voltage connection line 333 to the second VDD voltage line 332, the first VDD voltage connection line 334 and the second VDD voltage connection line 335 constitute different layers and are electrically connected to each other.

The VDD voltage connection line 333 electrically connects the first VDD voltage line 331 and the second VDD voltage line 332 sandwiching the display regions DA therebetween to each other. Thus, the first VDD voltage connection line 334 and the second VDD voltage connection line 335 constitute different layers so that the VDD voltage connection line 333 does not form a short-circuit with various line connection pads and lines in a region between the first and second VDD voltage lines 331 and 332.

Thus, the VDD voltage connection line 333 may be embodied as the first VDD voltage connection line 334 in a region between the first VDD voltage line 331 and the display region DA. When the VDD voltage connection line 333 extends across the display region DA, the VDD voltage connection line 333 may be embodied as the second VDD voltage connection line 335. That is, the VDD voltage connection line 333 changes from the first VDD voltage connection line 334 to the second VDD voltage connection line 335.

That is, the first VDD voltage connection line 334 and the second VDD voltage connection line 335 constitute different layers and are electrically connected to each other via at least one contact-hole.

Then, the VDD voltage connection line 333 may be embodied as the first VDD voltage connection line 334 which may be connected to the second VDD voltage line 332, as shown in FIG. 12, in a region between the display region DA and the second VDD voltage line 332.

In this case, the first VDD voltage connection line 334 and the second VDD voltage line 332 may be electrically connected to each other via the second VDD voltage connection line 335 connected to the first VDD voltage connection line 334 via at least one second VDD voltage connection line contact-hole 335h.

In addition, auxiliary lines 327 connected to the second VDD voltage line 332 via at least one contact-hole may be disposed in a region where the second VDD voltage line 332 does not overlap the data line 313 and VSS voltage connection line 323.

The auxiliary line 327 and the gate electrode 214 may be made of the same material and may constitute the same layer.

The VDD voltage auxiliary line 327 may be connected to a rear face of the second VDD voltage line 332 to reduce an overall resistance of the second VDD voltage line 332.

Figure 7:
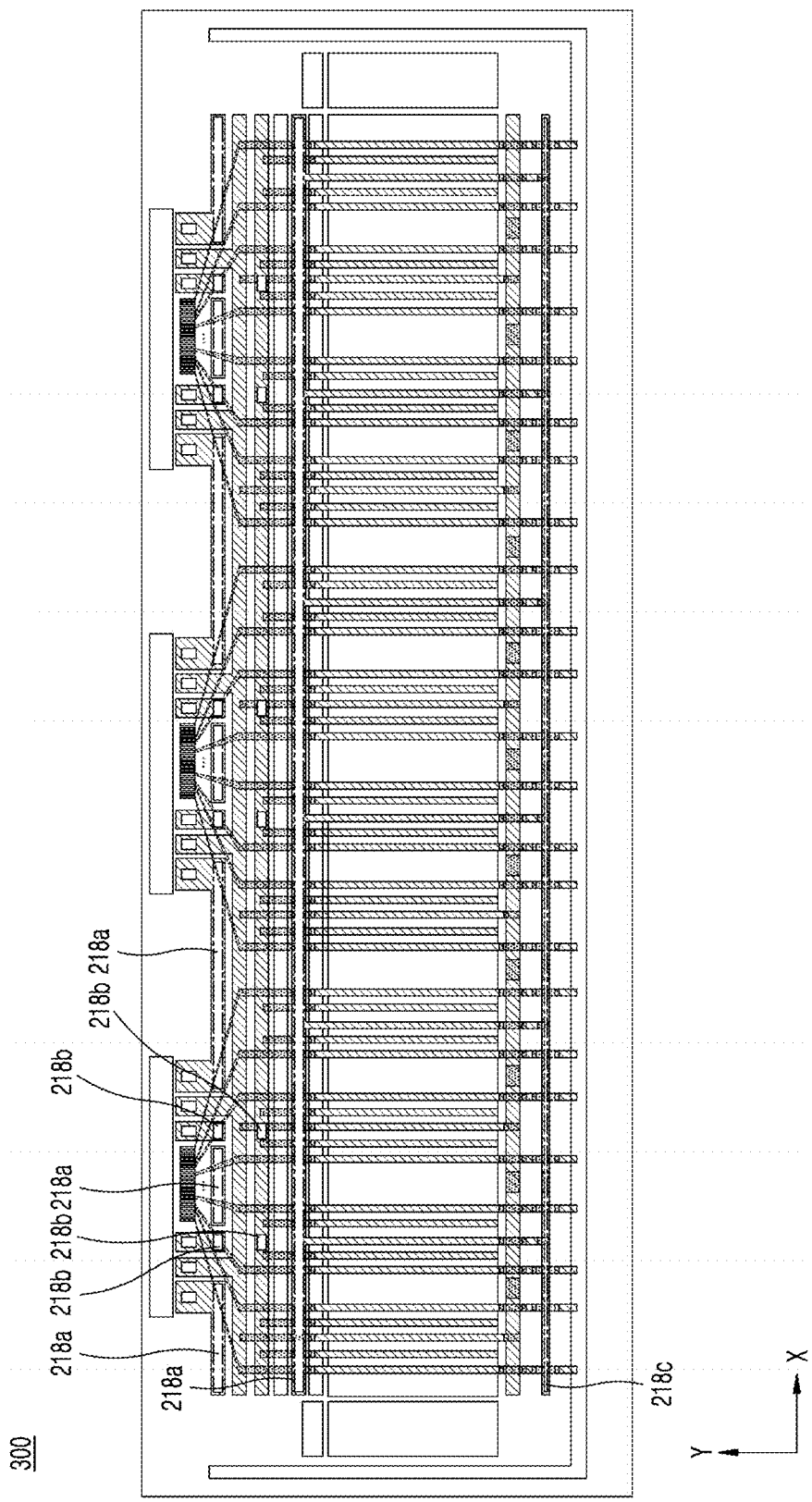
Figure 8:
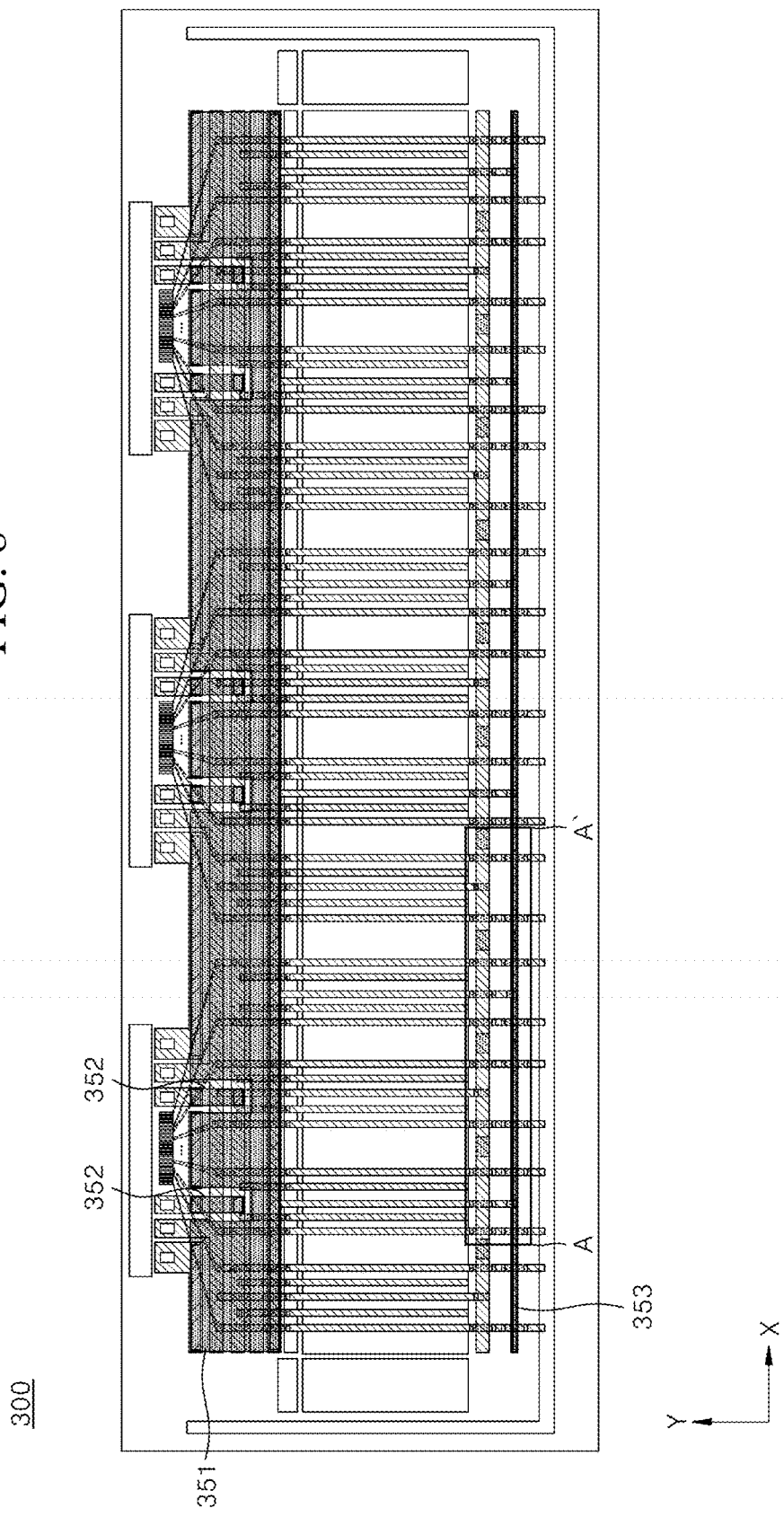

FIG. 7 additionally shows a passivation-hole formed in the passivation layer 218. FIG. 8 further shows a first connection electrode 351 connecting the VSS voltage line connection pad 320 and the first VSS voltage line 321 to each other, and a second connection electrode 352 connecting the reference voltage line connection pad 340 and the reference voltage line 341 to each other.

The passivation layer 218 may be formed on the reference voltage line connection pad 340, the VDD voltage line connection pad 330, the VSS voltage line connection pad 320, the reference voltage line 341, the first VSS voltage line 321, the second VSS voltage line 322, the first VDD voltage line 331, and the second VDD voltage line 332. The passivation layer 218 may act as a planarization layer made of an organic material layer such as PAC.

Further, the passivation layer 218 serves as an insulating layer. Thus, for electrical connection between the line connection pads and the lines, a passivation-hole, that is, a planarization-hole may be formed in portions of each line connection pad and each line.

The passivation-hole means not only a contact-hole, but also an open hole formed by partially removing the passivation layer 218 to secure a contact area as much as possible. Each line connection pad and each line may be electrically connected to each other via the connection electrodes connected to each other via the passivation-hole.

In FIG. 7, in order to clarify distinction between the layers, the passivation layer 218 is not shown separately, but only a region where the passivation-hole is formed is shown in an emphasis manner.

Figure 14:
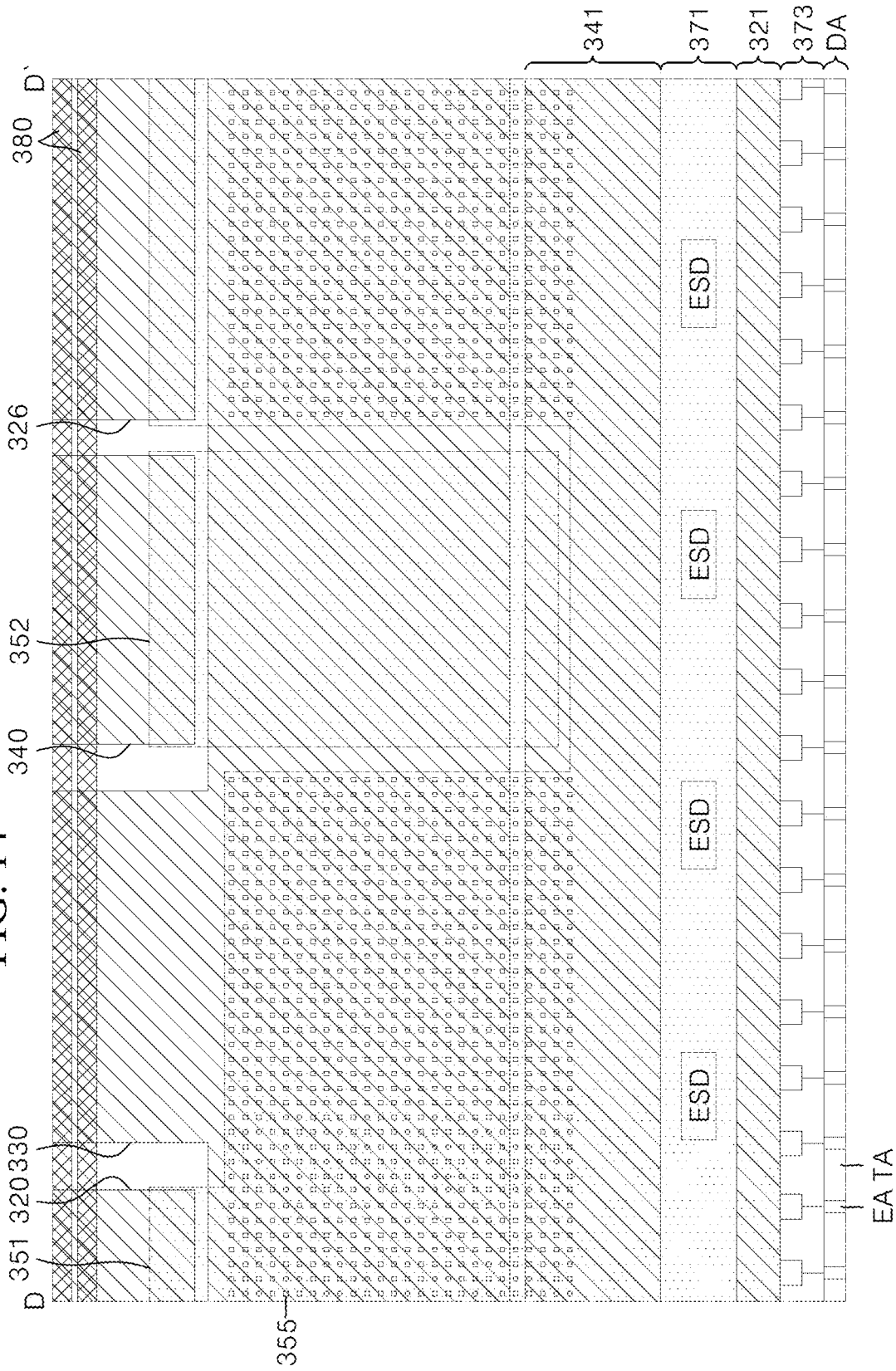
FIG. 14 is an enlarged plan view of a D-D' region of FIG. 9.

A first passivation-hole 218a is formed on the VSS voltage line connection pad 320 and the first VSS voltage line 321. The first connection electrode 351 electrically connects the VSS voltage line connection pad 320 and the first VSS voltage line 321 to each other via the first passivation-hole 218a, as shown in FIG. 8 and FIG. 14.

In other words, in order to prevent a short circuit between the VSS voltage line connection pad 320 and the first VSS voltage line 321 and the first VDD voltage line 331 and the reference voltage line 341 disposed between the VSS voltage line connection pad 320 and the first VSS voltage line 321, a jumping connection structure of an electrode to connect the VSS voltage line connection pad 320 and the first VSS voltage line 321 to each other may be beneficial.

Therefore, according to an embodiment of the present disclosure, the passivation layer 218 is formed on the first VDD voltage line 331 and the reference voltage line 341. The first passivation-hole 218a is formed on the VSS voltage line connection pad 320 and the first VSS voltage line 321.

Thus, the jumping connection structure of the electrode may be formed using the first connection electrode 351 which is formed on the passivation layer 218 and whose one portion is connected to the VSS voltage line connection pad 320 via one first passivation-hole 218a and whose an opposite portion is connected to the first VSS voltage line 321 via an opposite first passivation-hole 218a.

The first connection electrode 351 and the anode electrode as the first electrode 221 constituting the organic light-emitting element 220 may be made of the same material and may constitute the same layer.

The first connection electrode 351 electrically connects the VSS voltage line connection pad 320 and the first VSS voltage line 321 to each other and, to this end, is preferably formed to have a large area as much as possible in order to reduce or minimize electrical resistance and to increase or maximize uniformity of the resistance distribution.

Therefore, the first connection electrode 351 may be formed to extend over the first VDD voltage line 331, the reference voltage line 341, and the first VSS voltage line 321, and thus may be formed to have an increased area or a maximum area.

However, the first connection electrode 351 does not extend over all regions of the first VDD voltage line 331 and the reference voltage line 341 and the first VSS voltage line 321. The first connection electrode 351 does not extend over a partial region such as a region of the second connection electrode 352 as described later or a spacing region between the first and second connection electrodes 351 and 352.

Further, in ordered to increase or maximize a contact area of the first passivation-hole 218a with the VSS voltage line connection pad 320 and the first VSS voltage line 321, the first passivation-hole 218a may have a shape corresponding to the first VSS voltage line 321, that is, a long bar shape (an elongated bar shape).

Further, at least one gas exhaust hole 355 may be formed in at least a partial region of the first connection electrode 351 as shown in FIG. 14.

The gas exhaust hole 355 serves to discharge unnecessary gases that may be generated during a process of forming the transparent display panel 300. Thus, when forming the gas exhaust hole 355 in the first connection electrode 351 having a large area, reliability of the transparent display panel 300 may be further enhanced.

The bank layer 231 formed on the first connection electrode 351 has open regions defined therein corresponding to the gas exhaust holes 355 to secure a passage of the gas exhaust hole 355. Each bank layer 231 may define a boundary between adjacent gas exhaust holes 355.

Further, a VSS voltage auxiliary line connection pad 326 may be additionally disposed and may be electrically connected to the first VSS voltage line 321 via the first connection electrode 351.

The VSS voltage auxiliary line connection pad 326 and the VSS voltage line connection pad 320 may be made of the same material and constitute the same layer. However, the VSS voltage auxiliary line connection pad 326 has an island form separated from the VSS voltage line connection pad 320 and not connected to a separate line.

The first passivation-hole 218a is formed on the VSS voltage auxiliary line connection pad 326 such that the VSS voltage auxiliary line connection pad 326 is connected to the first connection electrode 351 via the first passivation-hole 218a, thereby increasing a total area of the first connection electrode 351, thereby reducing the overall resistance and making the resistance distribution more uniform.

In one example, the passivation layer 218 is formed on the reference voltage line connection pad 340 and the reference voltage line 341. The second connection electrode 352 electrically connects the reference voltage line connection pad 340 and the reference voltage line 341 to each other via a second passivation-hole 218b as shown in FIG. 8 and FIG. 14.

In order to prevent a short circuit between the reference voltage line connection pad 340 and the reference voltage line 341 and the first VDD voltage line 331 between the reference voltage line connection pad 340 and the reference voltage line 341, a jumping structure of an electrode for connecting the reference voltage line connection pad 340 and the reference voltage line 341 to each other may be beneficial.

Therefore, according to an embodiment of the present disclosure, the passivation layer 218 is formed on the first VDD voltage line 331, and the second passivation-hole 218b is formed on each of the reference voltage line connection pad 340 and the reference voltage line 341, as shown in FIG. 7.

Thus, the jumping connection structure of an electrode may be formed using the second connection electrode 352 which is formed on the passivation layer 218 and whose one portion is connected to the reference voltage line connection pad 340 via one second passivation-hole 218b and whose an opposite portion is connects to the reference voltage line 341 via an opposite second passivation-hole 218b.

The second connection electrode 352 and the first connection electrode 351 may be made of the same material and may constitute the same layer but may be spaced apart from each other. Thus, the second connection electrode 352 may have an island shape.

Therefore, the second connection electrode 352 and the anode electrode as the first electrode 221 constituting the organic light-emitting element 220 of the pixel may be made of the same material and may constitute the same layer.

The second connection electrode 352 electrically connects the reference voltage line connection pad 340 and the reference voltage line 341 to each other and, to this end, is preferably formed to have a large area as much as possible in order to reduce or minimize resistance thereof and increase or maximize uniformity of resistance distribution thereof. Further, the second passivation-hole 218b is formed to have a large area as much as possible to increase or maximize a contact area thereof with the reference voltage line connection pad 340 and the reference voltage line 341.

Further, at least one gas exhaust hole 355 may be formed in a partial region of the second connection electrode 352 as in the first connection electrode 351.

In one example, a third passivation-hole 218c may be formed on the second VSS voltage line 322, as shown in FIG. 7. As shown in FIG. 8, a third connection electrode 353 may be formed on the third passivation-hole 218c.

The third passivation-hole 218c formed on the second VSS voltage line 322 is intended for connecting the second VSS voltage line 322 and the third connection electrode 353 to each other. The third connection electrode 353 is electrically connected to the second VSS voltage line 322 via the third passivation-hole 218c.

In order to reduce the resistance by increasing or maximizing the contact area between the second VSS voltage line 322 and the third connection electrode 353, the third passivation-hole 218c may have a bar shape corresponding to the second VSS voltage line 322.

Further, when forming the third connection electrode 353 at a lower end portion of the transparent display panel 300, an effect may occur that a difference between vertical levels of the lower end portion of the transparent display panel 300 and an upper end portion of the transparent display panel 300 in which the first connection electrode 351 and the second connection electrode 352 may be removed.

The third connection electrode 353, the first connection electrode 351 and the second connection electrode may be made of the same material and may constitute the same layer but may be spaced apart from each other. Thus, the third connection electrode 353 is formed to have an island shape.

Accordingly, the third connection electrode 353 and the anode electrode as the first electrode 221 constituting the organic light-emitting element 220 of the pixel may be made of the same material and may constitute the same layer.

Figure 9:
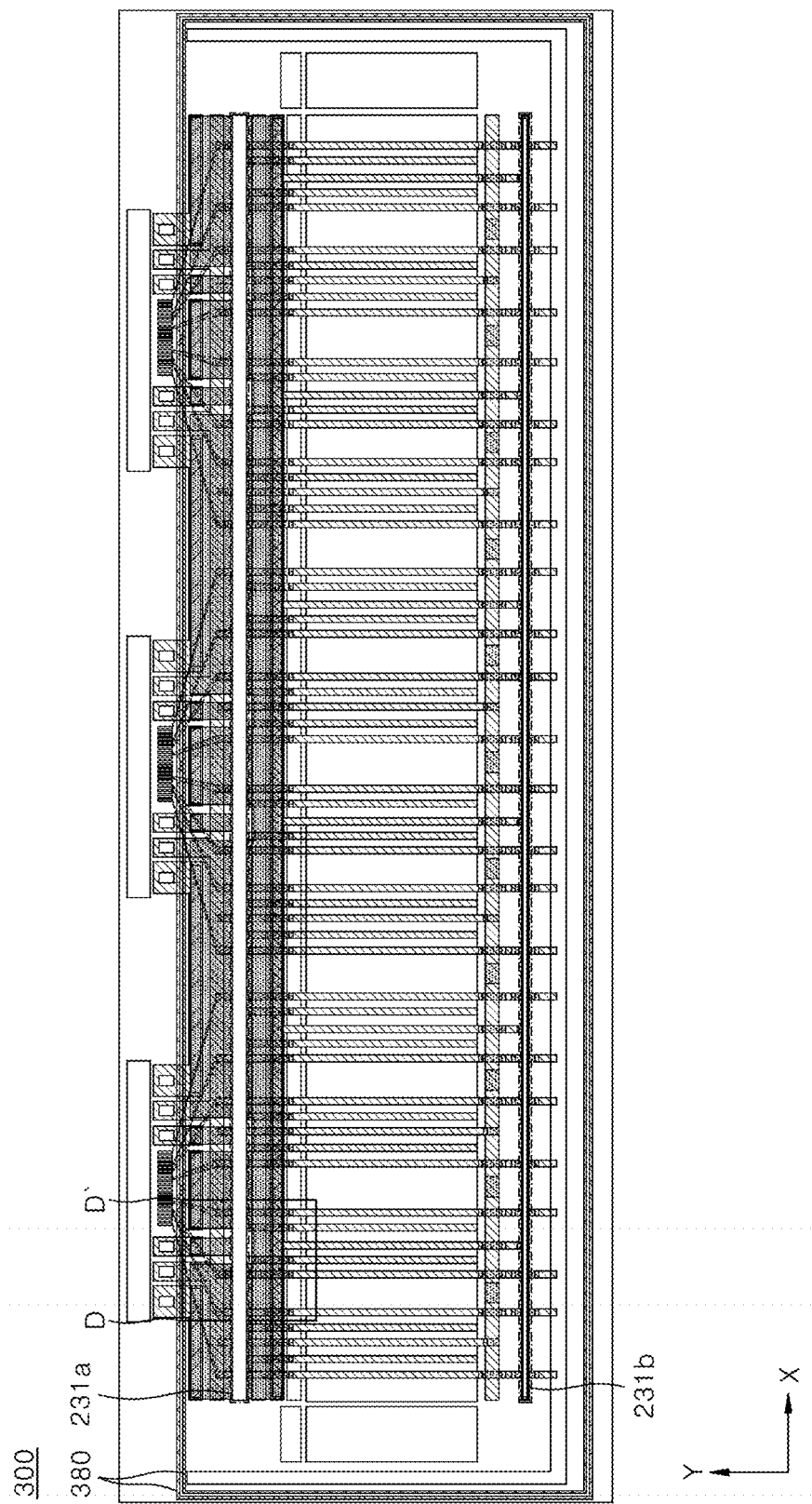

The bank layer 231 may be formed on the first connection electrode 351, the second connection electrode 352 and the third connection electrode 353. As shown in FIG. 9, the bank layer 231 may form a dam 380 disposed in the non-display region NDA to surround the display region DA. The dam 380 may include at least one dam 380 as patterned. When the dam 380 is formed on the first substrate 200, the dam 380 may serve to prevent an encapsulating material used to form the encapsulating layer 250 from flowing to an outside.

The dam 380 may be disposed in the non-display region NDA, and may be disposed to surround the lighting tester 375 and the first VDD voltage line 331 disposed in the non-display region NDA.

In one example, a fourth connection electrode 354 is formed on the bank layer 231, and is connected to the cathode electrode as the second electrode 225 of the pixel. The fourth connection electrode 354 is electrically connected to the VSS voltage line to apply a VSS voltage to the cathode electrode of the pixel. In this case, the cathode electrode and the fourth connection electrode 354 may be formed integrally with each other.

One end of the fourth connection electrode 354 is electrically connected to the first connection electrode 351 to which the VSS voltage is applied, while the other end of the fourth connection electrode 354 is electrically connected to the third connection electrode 353, thereby to apply the VSS voltage to the cathode electrode.

Figure 10:
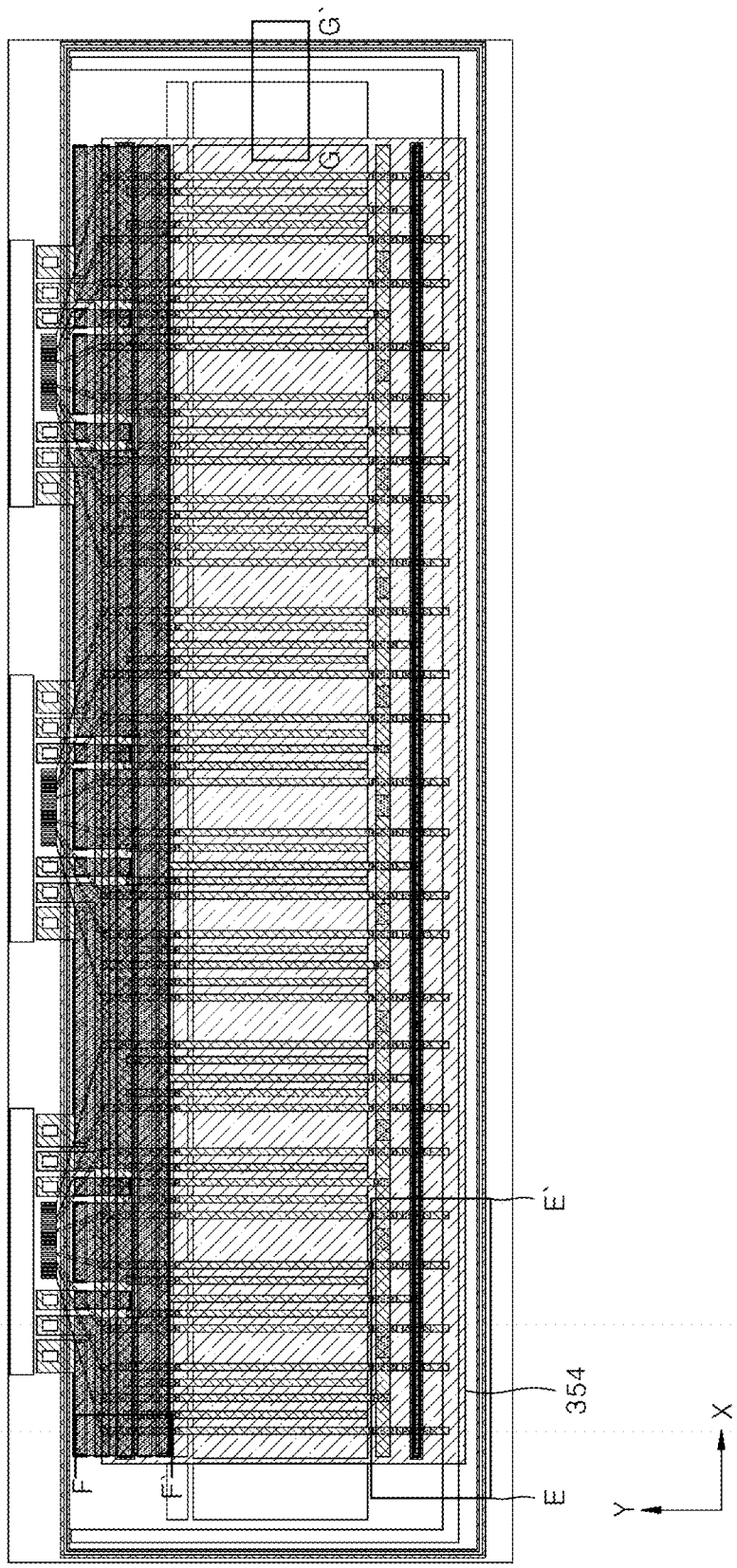
Figure 11:
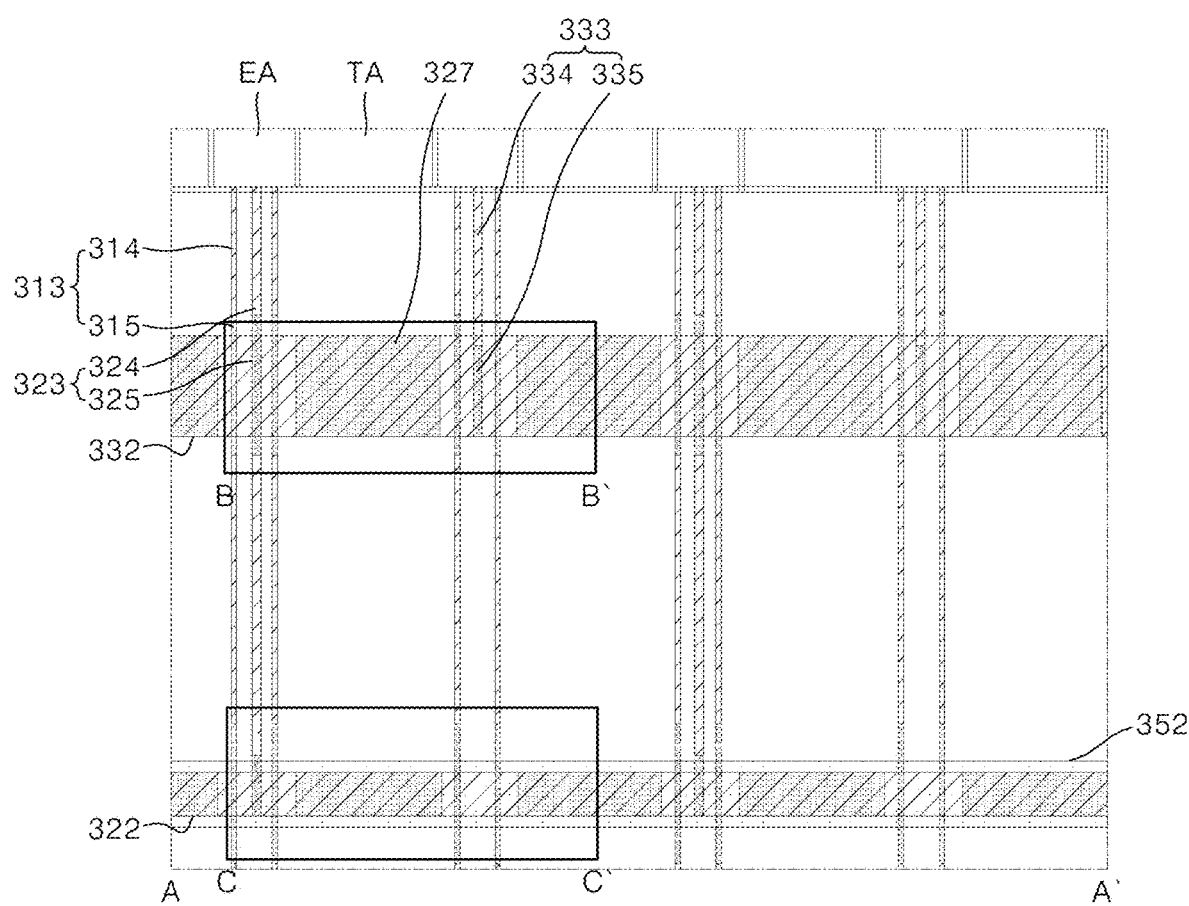
FIG. 11 is an enlarged plan view of a A-A' region in FIG. 8.
Figure 16:
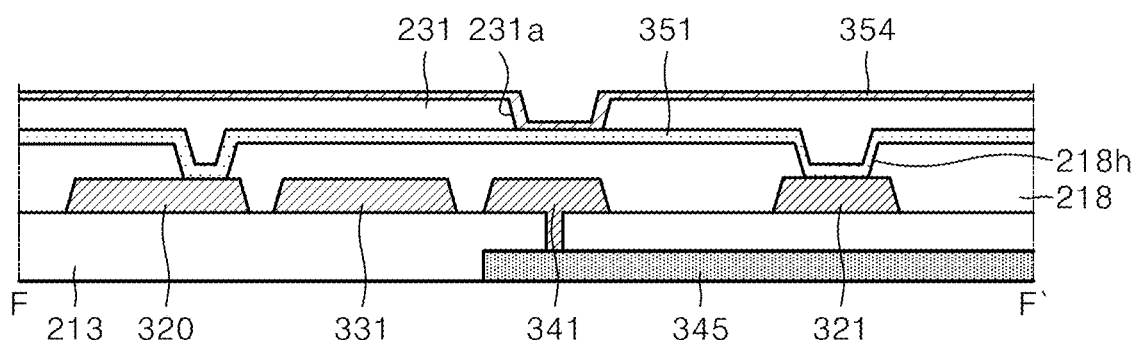
FIG. 16 is an enlarged cross-sectional view of a F-F' region in FIG. 10.

As shown in FIG. 9, FIG. 10 and FIG. 16, the bank layer 231 is formed on the first connection electrode 351. A first bank-hole 231a is formed on the first connection electrode 351 and is formed by removing a partial region of the bank layer 231, thereby to expose the first connection electrode 351 to an outside. Thus, the first connection electrode 351 may be electrically connected to one end of the fourth connection electrode 354 via the first bank-hole 231a.

When the VSS voltage is applied to the fourth connection electrode 354, the fourth connection electrode 354 is not directly connected to the first VSS voltage line 321, but the fourth connection electrode 354 is connected thereto via the first connection electrode 351 made of a same material as an anode electrode, thereby to reduce an electrical resistance.

To increase or maximize the contact area between the first connection electrode 351 and the fourth connection electrode 354, the first bank-hole 231a of the bank layer 231 on the first connection electrode 351 may be formed in a bar shape as in the reference voltage line 341.

Further, the first bank-hole 231a may be formed in a corresponding manner to the reference voltage line 341 or the first VSS voltage line 321. For example, in some cases, the first bank-hole 231a may overlap with either the reference voltage line 341 or the first VSS voltage line 321.

For example, when the first bank-hole 231a is formed on a separate circuit region such as an ESD protection circuit region 371, there may be a problem that the bank-hole is formed in a region where a flatness is poor.

Further, when the first bank-hole 231a is formed on a line far away from the first VSS voltage line 321 such as the first VDD voltage line 331, a current path of the fourth connection electrode 354 which is electrically connected to the first VSS voltage line 321 via the first bank-hole 231a becomes longer. Thus, the resistance increases correspondingly.

For example, when a length of a connection to the fourth connection electrode 354 as the cathode electrode of the high resistance rather than the anode electrode of the low resistance is larger, the overall resistance may be greater.

Thus, according to an embodiment of the present disclosure, the first bank-hole 231a is preferably formed on the reference voltage line 341 or the first VSS voltage line 321.

When the first bank-hole 231a is formed on the reference voltage line 341, an inclined face of the hole may be removed to obtain a high flatness, thereby to reduce resistance variation than when a bank-hole is formed in a portion of the bank layer 231 on which no line is formed.

Further, when the first bank-hole 231a is formed on the first VSS voltage line 321, a length of a connection between the fourth connection electrode 354 and the first VSS voltage line 321 becomes smaller, thereby reducing the resistance.

As shown in FIG. 9 and FIG. 10, a second bank-hole 231b formed by removing a partial region of bank layer 231 is formed in a portion of the bank layer 231 on the third connection electrode 353 electrically connected to the second VSS voltage line 322, thereby to electrically connect an opposite portion of the fourth connection electrode 354 to the third connection electrode 353.

In this case, the second bank-hole 231b is formed to correspond to a third passivation-hole 218c on the second VSS voltage line 322. Thus, while the second VSS voltage line 322, the third connection electrode 353 and the fourth connection electrode 354 are in a stacked state, they electrically contact each other at the same position. For example, in some cases, the second bank-hole 231b overlaps with a third passivation-hole 218c on the second VSS voltage line 322.

In addition, the second VSS voltage line 322 is not directly connected to the cathode electrode, but is connected thereto via the third connection electrode 353 as a low-resistance anode electrode, thereby to reduce resistance.

Due to the connection structure of the fourth connection electrode 354, the VSS voltage may be applied to the fourth connection electrode 354. Thus, the VSS voltage may be applied to the cathode electrode of the organic light-emitting element 220. That is, the VSS voltage applied from the VSS voltage line connection pad 320 may be applied to the fourth connection electrode 354 via the first VSS voltage line 321 and the first connection electrode 351.

The fourth connection electrode 354 may extend across an entirety of the display region DA including the first VDD voltage line 331, the reference voltage line 341, the first VSS voltage line 321, the second VDD voltage line 332 and the second VSS voltage line 322.

Figure 15:
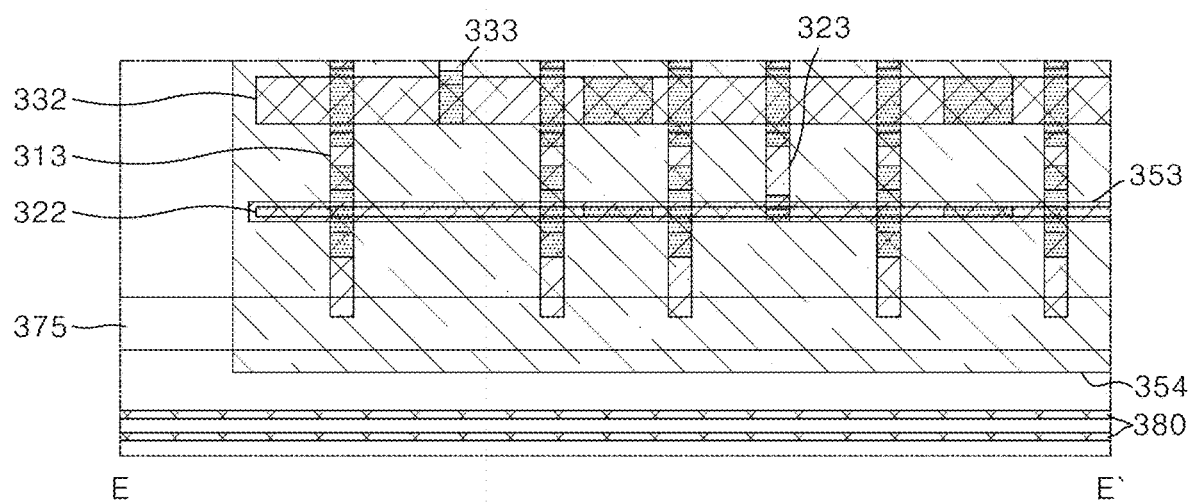
FIG. 15 is an enlarged plan view of a E-E' region of FIG. 10.

For example, as shown in FIG. 15, the cathode electrode may extend across an entirety of the display region DA including the second VDD voltage line 332 and the second VSS voltage line 322, and may be surrounded with the dam 380.

Figure 17:
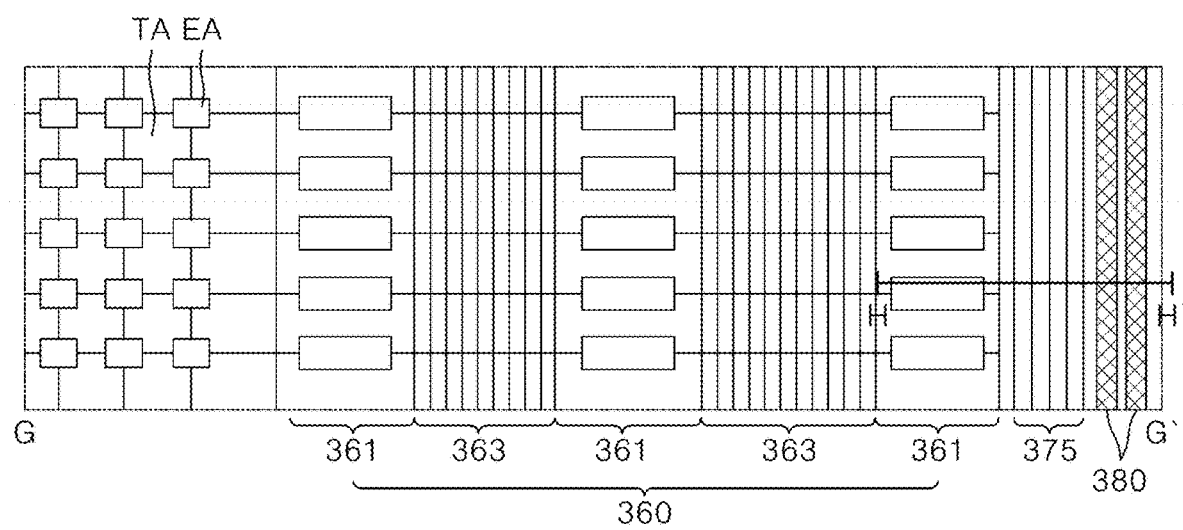
FIG. 17 is an enlarged plan view of a G-G' region of FIG. 10.

In one example, the GIP circuit region 360 includes a GIP division block 361 and a clock signal line region 363, as shown in FIG. 17.

The GIP division block 361 includes at least one GIP division block that divides the gate lines GL into multiple blocks and drives each of the multiple blocks in each of multiple display driving periods. The clock signal line region 363 may include at least one clock signal lines to control nodes of the GIP circuit region 360.

The GIP division block 361 and the clock signal line region 363 may be alternately arranged in a direction away from the display region DA.

Specifically, non-transparent and thick VSS voltage lines may be omitted in left and right portions of the non-display region NDA left and right to the display region DA. Thus, the GIP circuit region 360 may occupy a region increased by the omitted area.

Therefore, the GIP division block 361 and the clock signal line region 363 constituting the GIP circuit region 360 may be arranged in a non-compacted manner. Thus, a transparent region may be secured even in the GIP circuit region 360.

For example, in a case where a space of the GIP circuit region 360 is narrow, the GIP division block 361 and the clock signal line region 363 must be arranged in a very dense manner to increase or maximize space utilization. Thus, it is difficult to secure a separate transparent region In the GIP circuit region 360.

To the contrary, when the space of the GIP circuit region 360 increases as in one embodiment of the present disclosure, the GIP division block 361 having a non-transparent region at a larger amount and the clock signal line region 363 having a transparent region at a larger amount may be alternately arranged in the GIP circuit region 360 in a distinguished manner. Thus, the transparent region may be secured to the maximum even in the GIP circuit region 360.

Figure 18:
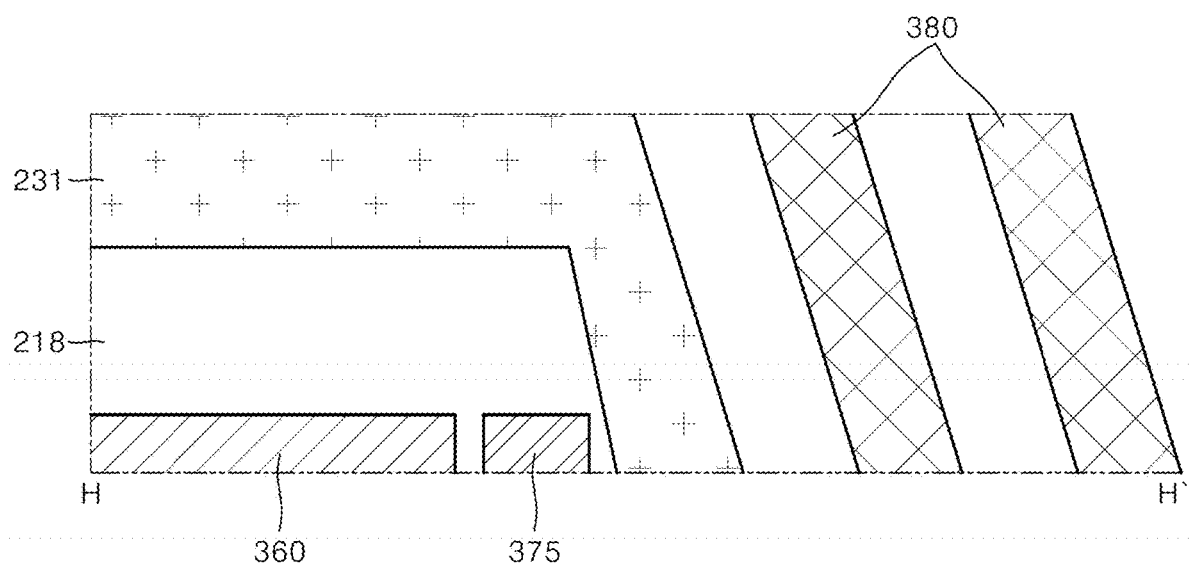
FIG. 18 is an enlarged cross-sectional view of a H-H' region of FIG. 17.

In other words, according to one embodiment of the present disclosure, the VSS voltage line is omitted in one side region of the non-display region NDA out of the display region DA where the GIP circuit region 360 is disposed, as shown in FIG. 17 and FIG. 18. Thus, reduction of a transparent region due to the non-transparent VSS voltage line may be reduced or minimized.

Therefore, the lighting tester 375 may be disposed between the dam 380 and the GIP circuit region 360, but the VSS voltage line may not be disposed between the dam 380 and the GIP circuit region 360.

A transparent display device should be capable of displaying image information to be displayed while having the same properties as those of a transparent glass substrate. A transparent display device having such characteristics may be configured as a complex transparent display device in which the display information and a spatial situation behind the transparent display device overlap each other. Representative examples thereof include a head-up-display (HUD) used in airplanes and automobiles.

Figure 19:
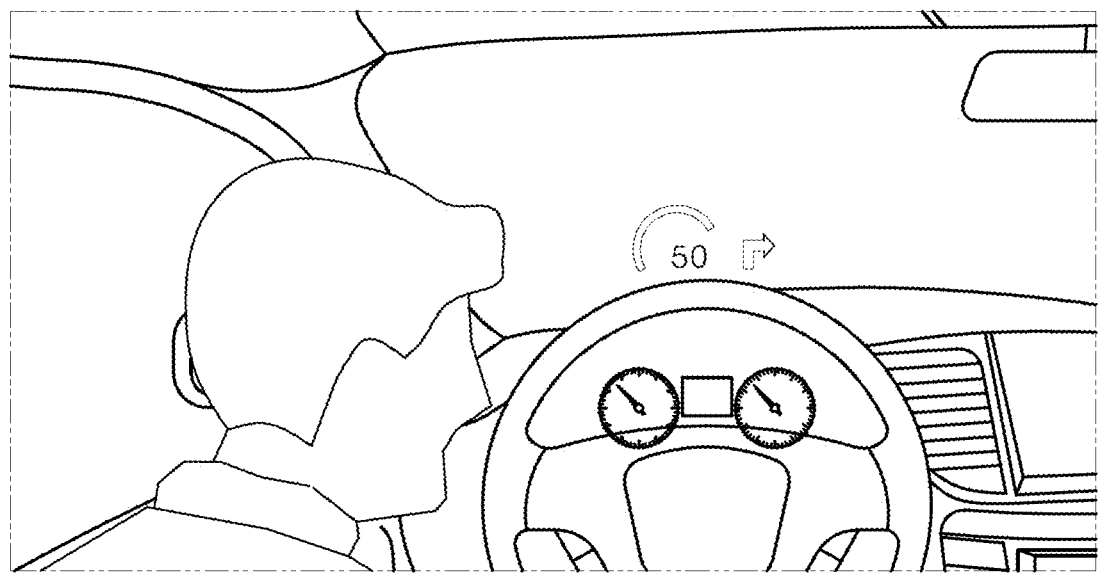
FIG. 19 is an embodiment of a transparent display device used as a head-up-display.

The head-up-display used in a vehicle as shown in FIG. 19 is mounted on a windshield of the vehicle to display various driving information to a driver while allowing the driver's front view to be secured.

Therefore, in the head-up-display, high visibility of display information is required. When a haze value is high, visibility of display information is not good. Thus, it is important to make the haze value as low as possible.

The haze is related to clarity of an object (or objects) seen through the transparent display device. Therefore, in a transparent display device having a high transmittance but a high haze value, there is a problem in that a driver sees the object in a blurry manner, and thus visibility of display information is deteriorated. Occurrence of the haze in the transparent display device may be attributed to the following light characteristics.

Figure 20A:
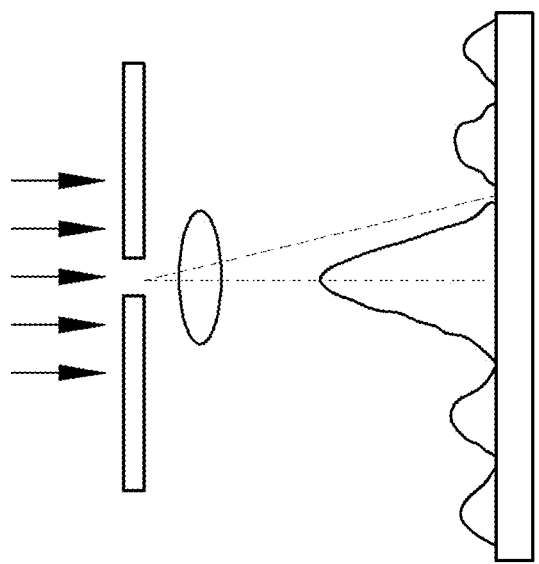
FIG. 20A shows a long-distance diffraction pattern by a single slit.
Figure 20B:
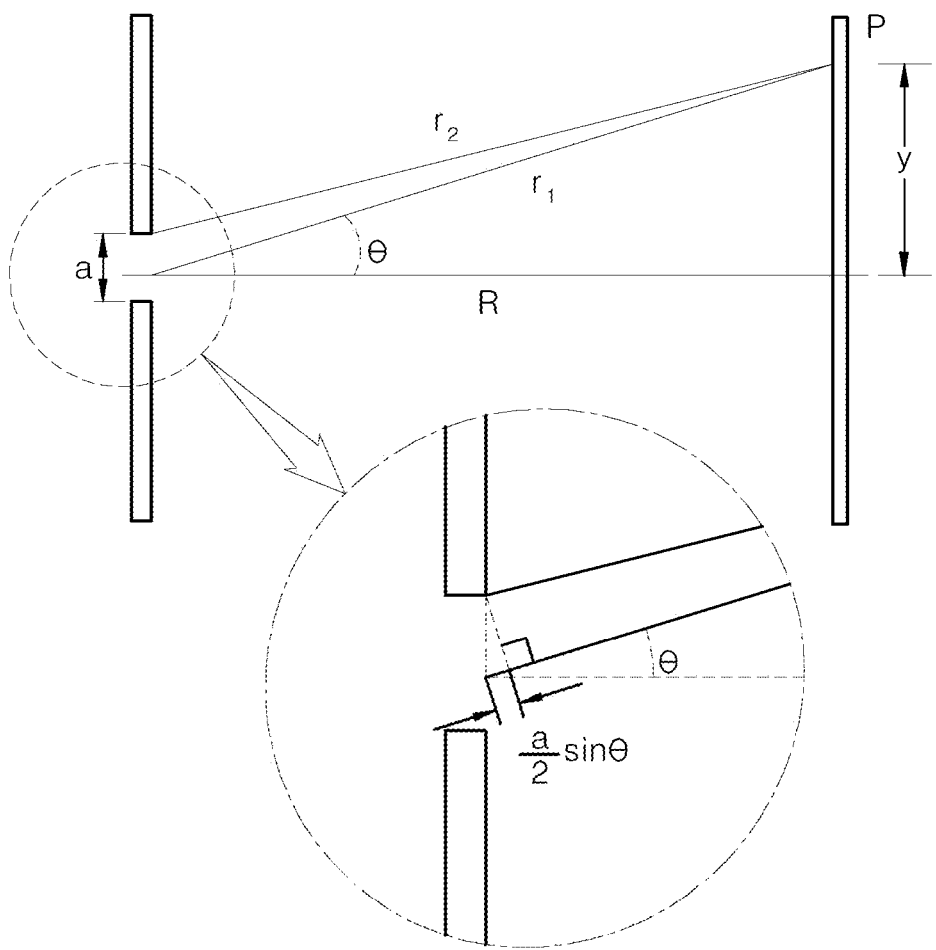
FIG. 20B is an illustration of a diffraction effect in a single slit.

FIG. 20A shows a long-distance diffraction pattern by a single slit. FIG. 20B is an illustration of a diffraction effect in a single slit.

Diffraction of a wave refers to a phenomenon in which a wave front is bent when the wave encounters an obstacle or a slit. In diffraction using a single slit, a surface wave of a certain wavelength having exited the slit forms a myriad of spherical waves.

In this regard, light may be treated as a wave in that a diffraction phenomenon occurs in a slit experiment using light as shown in FIG. 20A. As the light passes through the slit, diffraction appears in the same way as the surface wave. However, a myriad of new spherical waves interfere with each other, resulting in occurrence of contrasting diffraction patterns.

FIG. 20B shows Fraunhoffer diffraction in which a diffraction pattern is viewed at a long distance from a diffracting object. The Fraunhoffer diffraction occurs when all rays are considered as parallel rays, and the diffraction pattern is the same regardless of the distance.

A condition under which the Fraunhoffer diffraction occurs in a single slit may be calculated as follows.

When a difference between paths of two light beams traveling at an edge and a center of the slit respectively is r1−r2, $$r1 - r2 = \frac{a}{2}\sin\theta.$$

In this connection, a m-th offset interference condition in which an offset interference occurs is $$\frac{a}{2}\sin\theta = \pm\frac{m\lambda}{2}.$$

Since θ is usually much smaller than 1, a darkened point corresponds to a point away $$\theta = \pm\frac{m\lambda}{a} \text{ or}$$
$$ym = \pm\frac{m\lambda}{a}R$$

from the center.

FIG. 21A to FIG. 21D shows results of a double slit experiment for a particle, a wave, light, and an electron, respectively.

Figure 21A:
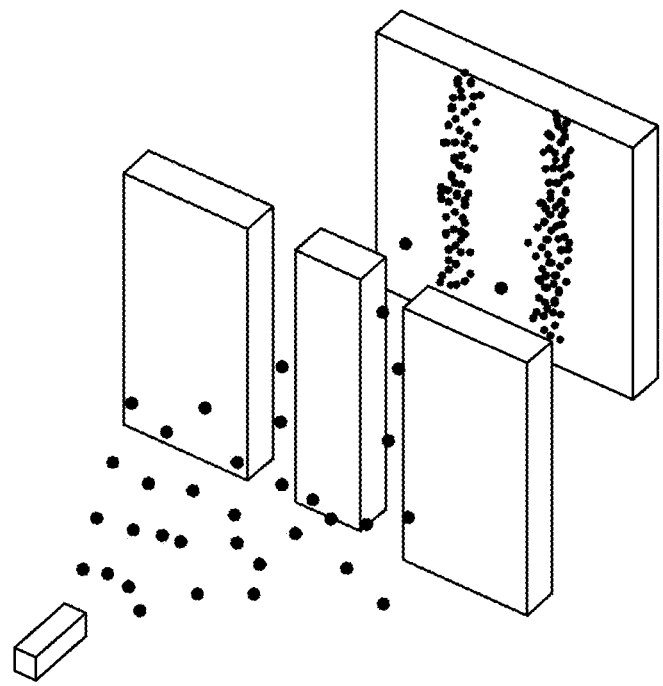
FIG. 21A to FIG. 21D show results of a double slit test for a particle, a wave, light and an electron, respectively.

When particles pass through a double slit, a distribution of particles hitting a screen appears as a simple sum of single distributions of the particles passing through a single slit as shown in FIG. 21A.

Figure 21B:
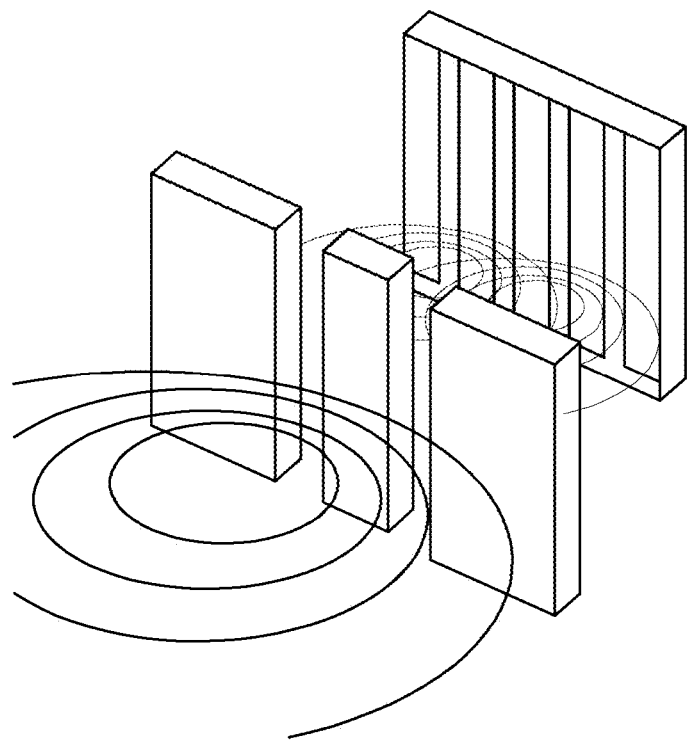

That is, in this case, a bright band appears on a portion of the screen corresponding not to a center of the screen but to a slit position. When the wave passes through the double slit, the brightest band appears at the center of the screen, as shown in FIG. 21B. This allow knowing whether interference occurs. Since the particles do not interfere with each other, a distribution of particles is strong at a position where they may pass through the slit in a best manner.

Figure 21C:
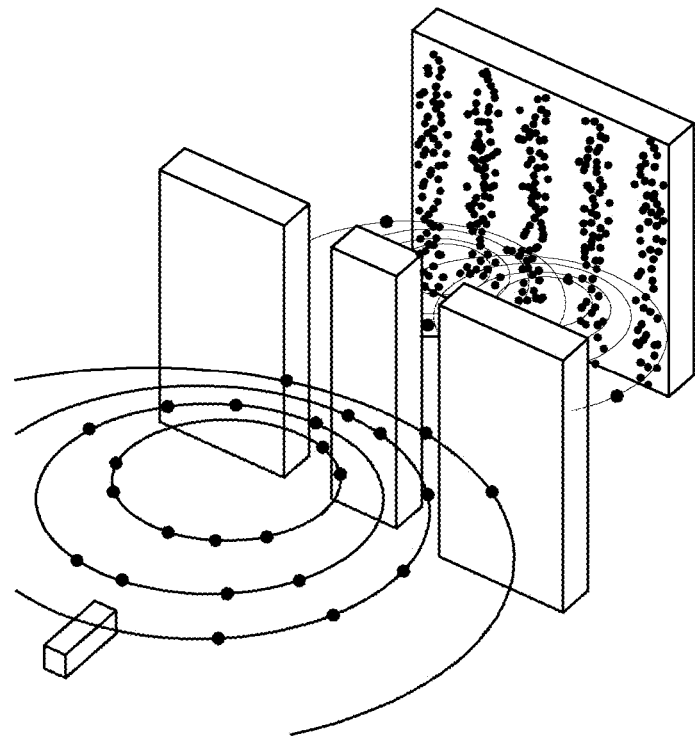
Figure 21D:
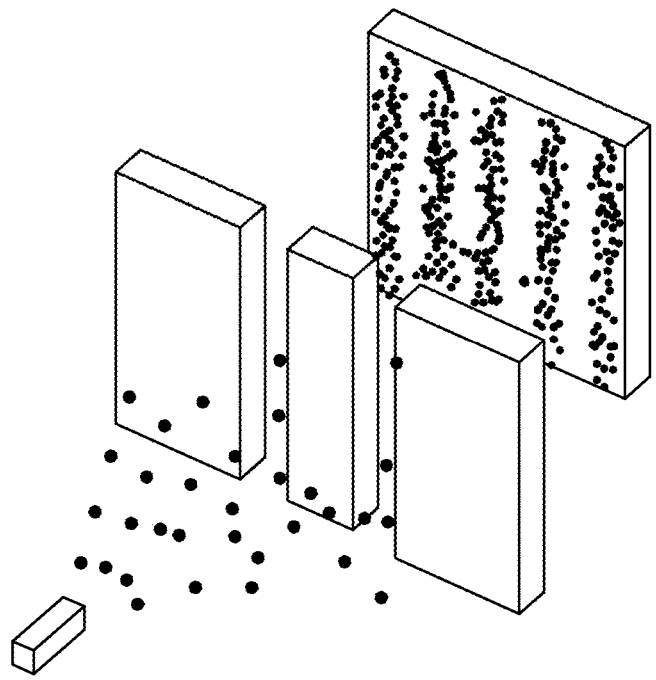

In one example, when the light passes through the double slit as shown FIG. 21C, an interference pattern resulting from a fact that the particle property thereof disappears and the wave passes therethrough occurs. Electron is generally considered to be a particle. However, when an electron accelerated at a high speed passes through a double slit as shown in FIG. 21D, a result appears as the same result as that of a double slit experiment of the wave.

That is, it may be seen that even when the particles pass through the double slit at a sufficiently high speed, the same interference as that occurring in the wave occurs. As a result, it may be seen that light has the wave-particle duality in that light is a wave generated by particles as photons that is sufficiently fast.

In this way, light has the properties of waves and particles at the same time. Thus, when the light encounters a slit having a periodic pattern, overlapping and offsetting occur, resulting in periodic diffraction. Consequently, the diffraction phenomenon due to the wave-particle duality of light may vary depending on a shape of the transmissive region which acts as a slit in the transparent display device.

Figure 22:
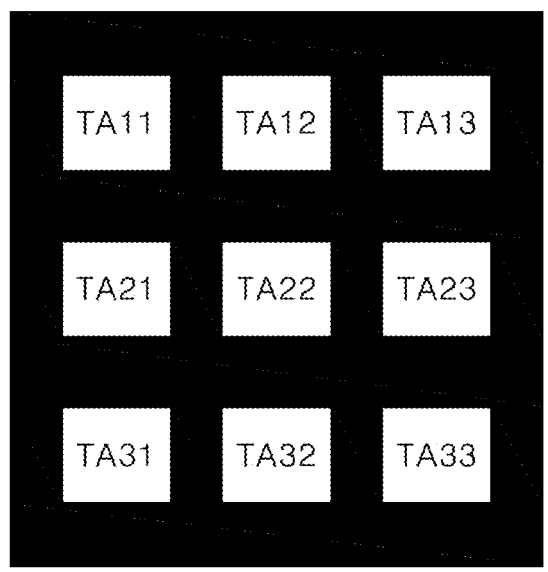
FIG. 22 shows an arrangement of typical quadrangle shaped transmissive regions in a transparent display device.

For example, FIG. 22 shows an arrangement of transmissive regions having a typical quadrangle shape in a transparent display device.

Multiple transmissive regions TAij in which i is a row number, and j is a column number (i and j are natural numbers) are arranged in a matrix type. Thus, the transmissive regions in a first row include TA11, TA12, TA13 . . . , the transmissive regions in a second row include TA21, TA22, TA23 . . . , and the transmissive regions in a third row include TA31, TA32, TA33 . . . . Similarly, the transmissive regions in a first column are TA11, TA21, TA31 . . . , the transmissive regions in a second column are TA12, TA22, TA32 . . . , and the transmissive regions in a third column are TA13, TA23, TA33 . . . .

In this case, each transmissive region has a rectangular shape having all internal angles of 90 degrees. As a result, each of the transmissive regions TA21 and TA23 adjacent to the transmissive region TA22 to the same row has a vertical side facing and parallel to a vertical side of the transmissive region TA22.

Further, each of the transmissive regions TA12 and TA32 adjacent to the transmissive region TA22 in the same column has a horizontal face facing and parallel to a horizontal side of the transmissive region TA22. That is, each of all sides of the transmissive region TA22 faces and is parallel to a corresponding side of each of adjacent transmissive regions. The same principle may be equally applied to other transmissive regions.

Since light transmits the transmissive regions, they may play the same role as the slit illustrated in the double slit experiment above. Therefore, occurrence or non-occurrence, and an intensity of diffraction of light may vary depending on shapes and an arrangement structure of the transmissive regions.

Diffraction of light is caused by periodic repetition of lines constituting the slit, and may be more clearly generated when adjacent lines constituting the slit have a periodicity in a parallel manner to each other or when the slits are periodically arranged.

Therefore, in the transparent display device, when the transmissive regions, each having the rectangular shape are arranged in a matrix type having regularity and periodicity in a parallel manner as shown in FIG. 22, the diffraction phenomenon of light may be clearly observed.

Figure 23:
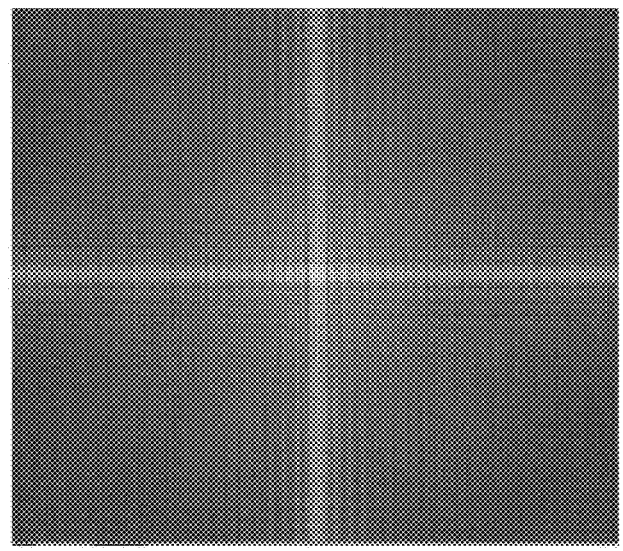
FIG. 23 shows diffraction phenomenon of light generated when light is incident onto a central region of a transparent display device having the transmissive region shape as shown in FIG. 22.

FIG. 23 shows the diffraction phenomenon of light generated when light is incident onto a central region of a transparent display device having the transmissive region shape and the arrangement structure of the transmissive regions as shown in FIG. 22.

As may be seen in FIG. 23, it may be seen that the diffraction phenomenon of light appears very clearly around the central region where the light is incident. As the diffraction phenomenon of light becomes more apparent in the transparent display device, the haze also increases. As a result, the clarity or visibility of the transparent display device is reduced.

Therefore, there is a need for a new pixel structure having a shape of a transmissive region that may reduce or minimize the diffraction of light caused by periodic repetition of lines in the transmissive regions. Thus, the present disclosure provides a new pixel structure including transmissive regions having a new transmissive region shape as follows.

A transparent display panel according to another embodiment of the present disclosure includes a substrate having a display region including a plurality of light-emitting regions and a plurality of transmissive regions, and a plurality of line regions disposed over the substrate and extending across the display region, wherein an outer contour of each of the transmissive regions is at least partially curved.

Figure 24:
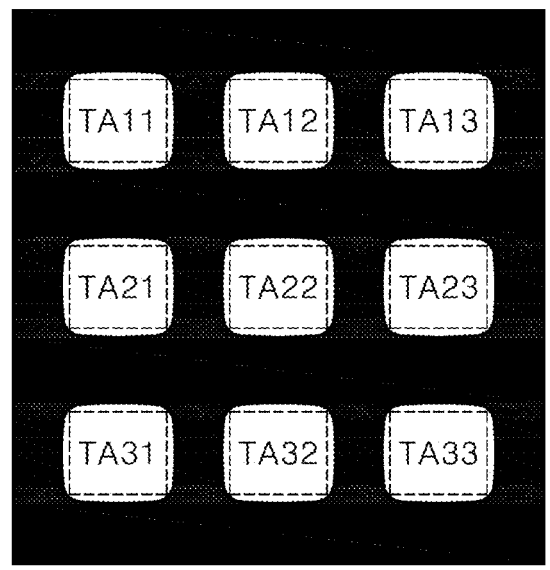
FIG. 24 to FIG. 26 show embodiments of the present disclosure in which a transmissive region in a transparent display device has a curved shape.

For example, in an embodiment of the present disclosure shown in FIG. 24, an outer contour of each of the transmissive regions may be partially curved. Specifically, the transmissive region TA22 has four outwardly convex sides corresponding to four sides of a dotted virtual rectangle drawn inside the transmissive region. The same feature may be applied to other transmissive regions.

Thus, mutually facing sides of the transmissive region TA22 and each of transmissive regions TA21 and TA23 adjacent to the transmissive region TA22 may not be parallel to each other. Further, mutually facing sides of the transmissive region TA22 and each of transmissive regions TA12 and TA32 adjacent to the transmissive region TA22 in the same column may not be parallel to each other.

Figure 25:
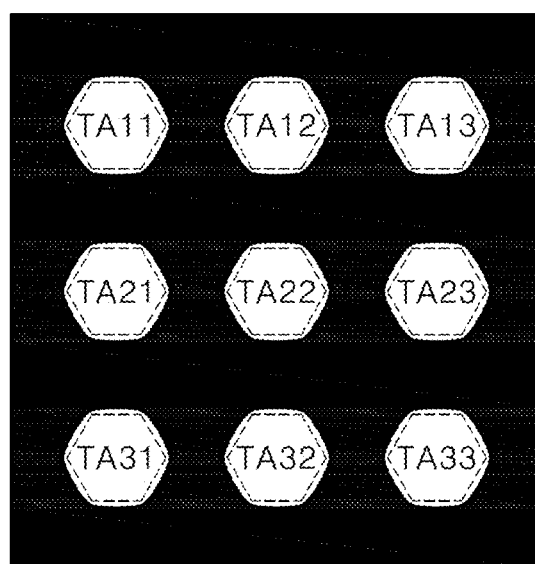

In another embodiment according to the present disclosure shown in FIG. 25, an outer contour of each of transmissive regions may be partially curved. Specifically, the transmissive region TA22 has six outwardly convex sides corresponding to six sides of a dotted virtual hexagon drawn inside the transmissive region. The same feature may be applied to other transmissive regions.

Thus, mutually facing sides of the transmissive region TA22 and each of transmissive regions TA21 and TA23 adjacent to the transmissive region TA22 may not be parallel to each other. Further, mutually facing sides of the transmissive region TA22 and each of transmissive regions TA12 and TA32 adjacent to the transmissive region TA22 in the same column may not be parallel to each other.

Figure 26:
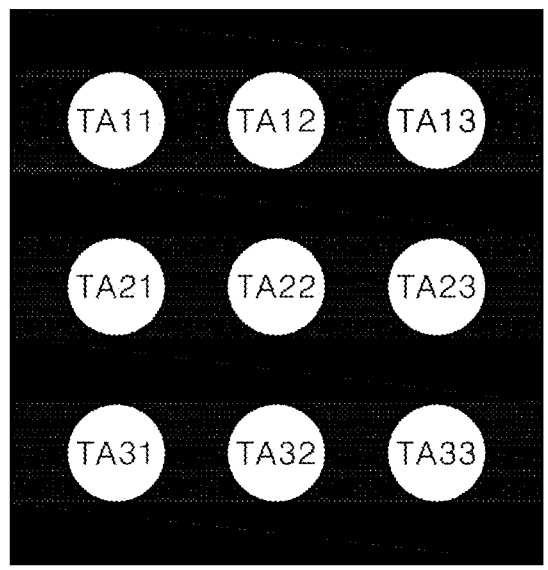

In still another embodiment according to the present disclosure shown in FIG. 26, an outer contour of each of transmissive regions has a circular shape. Specifically, the transmissive region TA22 is formed to have a circular shape. The same feature may be applied to other transmissive regions.

Thus, mutually facing sides of the transmissive region TA22 and each of transmissive regions TA21 and TA23 adjacent to the transmissive region TA22 may not be parallel to each other. Further, mutually facing sides of the transmissive region TA22 and each of transmissive regions TA12 and TA32 adjacent to the transmissive region TA22 in the same column may not be parallel to each other.

In other words, all sides of the transmissive region TA22 in FIG. 24 to FIG. 26 may not be parallel to all sides of each of adjacent transmissive regions thereto. The same features may be applied to other transmissive regions.

Therefore, even when the transmissive regions, each having the shape shown in FIG. 24 to FIG. 26, are arranged in a matrix type, parallel regularity and periodicity of the transmissive regions acting as slits are avoided, thereby reducing or minimizing the diffraction of light.

Further, in another embodiment according to the present disclosure, each of transmissive regions may be formed in an elliptical shape. Due to this elliptical shape, the parallel regularity and periodicity of the transmissive regions that act as the slit as illustrated above may be avoided, thereby reducing or minimizing the diffraction of light as much as possible.

Although FIG. 24 to FIG. 26 show that an entirety of the outer contour of each of the transmissive regions is curved by way of example, the present disclosure is not limited thereto. Even when only a portion of the contour of the transmissive region is curved, the parallel regularity and periodicity of the transmissive regions may be avoided, thereby reducing or minimizing the diffraction of light.

Therefore, in the transparent display panel including transmissive regions, each having the outer contour being at least partially curved, diffraction of light may be reduced or minimized, thereby to reduce the haze level. As a result, the clarity or visibility of the transparent display device may be improved.

Figure 27:
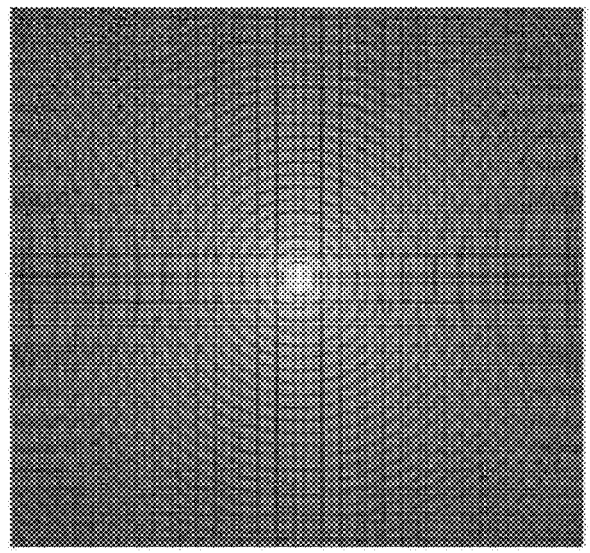
FIG. 27 shows diffraction phenomenon of light generated when light is incident onto a central region of a transparent display device having a circular transmissive region shape as shown in FIG. 26.

FIG. 27 shows the diffraction phenomenon of light generated when light is shot onto a central region of a transparent display device having a transmissive region of a circular shape and an arrangement structure of the transmissive regions as shown in FIG. 26. As may be seen in FIG. 27, substantially no diffraction of light is generated around the central region where light is incident.

Thus, non-occurrence of the diffraction of light in a transparent display device having a transmissive region of a circular shape and an arrangement structure of the transmissive regions as shown in FIG. 26 is clearer, compared to FIG. 23 which shows the result when light is incident onto the central region of the transparent display device having a conventional quadrangle transmissive region shape.

The diffraction of light is reduced or minimized, especially when the transmissive region has a circular shape. Thus, in order to reduce or minimize the diffraction interference of light, it is desirable to form the transmissive region to have a shape approximate to a circle as much as possible. However, when the outer contour of the transmissive region is at least partially curved, as in the circular transmissive region, an area of the transmissive region may be reduced. Thus, it may be difficult to design a pixel including the light-emitting region and the line region.

Therefore, hereinafter, another embodiment according to the present disclosure capable of designing an optimized transmissive region and an optimized light-emitting region while reducing or minimizing diffraction interference of light is illustrated.

A transparent display panel according to another embodiment according to the present disclosure includes a substrate including a display region including a plurality of light-emitting regions and a plurality of transmissive regions, and a plurality of line regions disposed over the substrate and extending across the display region, wherein each of the transmissive region has a polygonal shape, and all internal angles of the polygon are obtuse.

Figure 28:
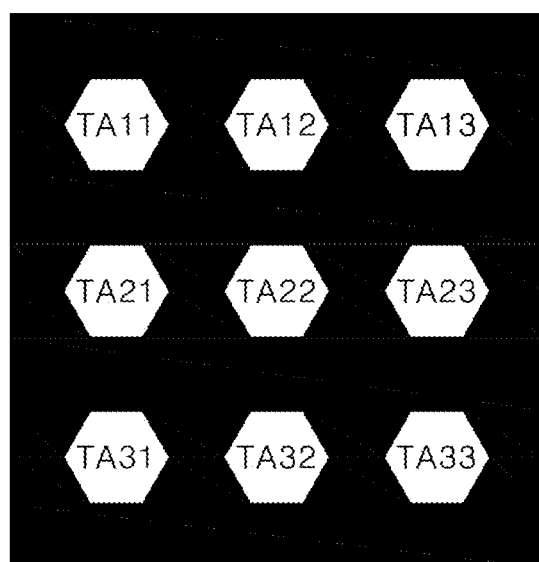
FIG. 28 and FIG. 29 show embodiments of the present disclosure in which a transmissive region in a transparent display device has a polygonal shape whose all internal angles are obtuse.

For example, as shown in FIG. 28, each of transmissive regions has a polygonal shape whose all internal angles are obtuse. That is, the polygon having all internal angles being an obtuse angle include all of polygons having at least 5 sides. The polygon may include all of the sides of lengths equal to each other.

Specifically, in FIG. 28, the transmissive region has a hexagon shape, and more specifically, a regular hexagon shape. This is one example. As shown in FIG. 28, mutually facing sides of the transmissive region TA22 and each of transmissive regions TA21 and TA23 adjacent to the transmissive region TA22 may not be parallel to each other. However, mutually facing sides of the transmissive region TA22 and each of transmissive regions TA12 and TA32 adjacent to the transmissive region TA22 in the same column may be parallel to each other.

Thus, when transmissive regions with hexagonal shapes are arranged as shown in FIG. 28, mutually facing sides of transmissive regions adjacent to each other in the same row may not be parallel to each other. Thus, the parallel regularity and periodicity of the transmissive regions are avoided, such that diffraction of light may be reduced or minimized as much as possible.

In other words, when mutually facing sides of transmissive regions adjacent to each other in the same row and/or column are not parallel to each other, diffraction of light may be reduced or minimized, compared to when mutually facing sides of transmissive regions adjacent to each other in the same row and/or column are parallel to each other.

In the hexagonal transmissive region shape shown in FIG. 28, a length of each of mutually facing sides of transmissive regions adjacent to each other in the same column is small. Thus, even when mutually facing sides of transmissive regions adjacent to each other in the same column are parallel to each other, the diffraction phenomenon of light may be reduced.

Therefore, even when transmissive regions, each having the shape shown in FIG. 28, are arranged in a matrix type in a transparent display device, the parallel regularity and periodicity of the transmissive regions acting as slits are avoided, such that diffraction of light may be reduced or minimized as much as possible.

Figure 29:
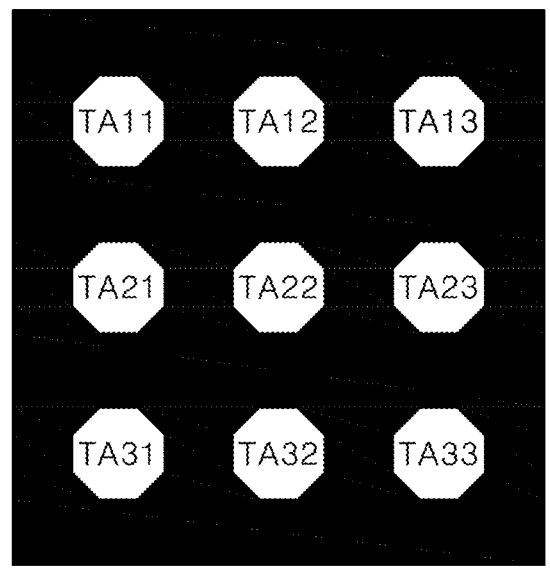

In another embodiment according to the present disclosure, as shown in FIG. 29, each of the transmissive regions has an octagon shape, especially, a regular octagon shape having all internal angles being an obtuse angle. This is one example. The octagon as shown in FIG. 29 is more approximate to a circle than the hexagon is, such that an effect similar to that as achieved by the transmissive region having a circular shape that minimizes diffraction of light may be obtained by the shape of FIG. 29.

In the octagonal transmissive region shape shown in FIG. 29, a length of each of mutually facing sides of transmissive regions adjacent to each other in the same column is small. Thus, even when mutually facing sides of transmissive regions adjacent to each other in the same column are parallel to each other, the diffraction phenomenon of light may be reduced.

Therefore, even when transmissive regions, each having the shape shown in FIG. 29, are arranged in a matrix type in a transparent display device, the parallel regularity and periodicity of the transmissive regions acting as slits are avoided, such that diffraction of light may be reduced or minimized as much as possible.

That is, a transmissive region of a polygonal shape in which all internal angles are obtuse, in particular, a transmissive region having a regular polygonal shape in which all internal angles are obtuse has a shape more approximate to a circle, thereby reducing or minimizing diffraction of light.

Further, an area of a transmissive region of a polygonal shape in which all internal angles are obtuse may be larger than an area of the curved or circular shaped transmissive region. Thus, when using a transmissive region of a polygonal shape in which all internal angles are obtuse, the pixel design and the line region design may be easier than that when using the curved or circular shaped transmissive region.

Therefore, a transparent display panel including a transmissive region having a polygonal shape in which all internal angles are obtuse may secure a maximum transmission region with the reduced haze level and may facilitate the design of the pixel and the line region.

Hereinafter, the arrangement shape of the light-emitting regions and the transmissive regions according to an embodiment of the present disclosure will be described in more detail, based on the embodiment in which the transmissive region has an octagon among the various embodiments of the transmissive region shapes as exemplified above.

Figure 30:
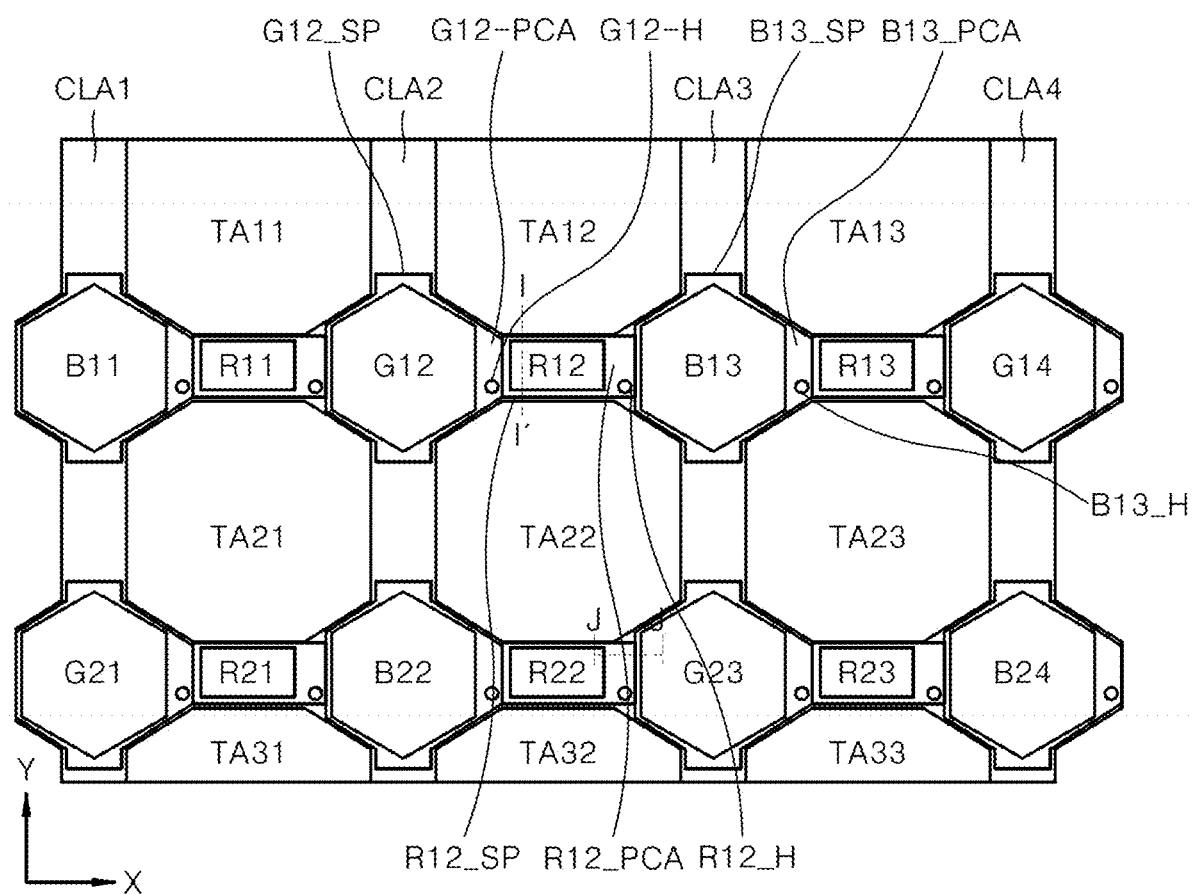
FIG. 30 shows a configuration in which transmissive regions and light-emitting regions of a transparent display device according to an embodiment of the present disclosure are arranged.

As shown in FIG. 30, a transparent display panel according to an embodiment of the present disclosure includes a substrate having a display region including a plurality of light-emitting regions and a plurality of transmissive regions, and line regions disposed on the substrate while extending across the display region. In this case, the transmissive region has a polygonal shape whose all internal angles are obtuse.

The transparent display panel may be composed of a transmission region including a plurality of transmissive regions TA through which light is transmitted, and a non-transmission region NTA through which light is not transmitted. In the transmission region, a plurality of transmissive regions are arranged in a matrix composed of a plurality of rows of transmissive regions and a plurality of columns of transmissive regions.

In this case, a plurality of transmissive regions arranged in the same row is referred to as one transmissive region row. A plurality of transmissive regions arranged in the same column is referred to as one transmissive region column. In the connection, the row direction refers to a horizontal direction of the substrate and coincides with the X-axis direction. The column direction is defined as the vertical direction of the substrate coinciding with the Y-axis direction.

The non-transmissive region NTA may include a light-emitting region in which light is emitted and a non-light-emitting region in which light is not emitted. The light-emitting region refers to a region in which a light-emitting region EA of a sub-pixel is disposed. The non-light-emitting region may contain a plurality of line regions CLA, each extending in the vertical direction of the substrate.

In this case, the plurality of line regions are column line regions CLA1, CLA2, CLA3, CLA4 . . . , each extending in a column direction. The plurality of line regions contains data lines and various voltage lines extending in the column direction. Further, a pixel circuit region PCA connected to the light-emitting region of each sub-pixel may be disposed in the non-light-emitting region.

The pixel circuit region PCA may be disposed under the light-emitting region EA and may be aligned with the light-emitting region EA. The PCA partially overlaps the light-emitting region EA and the non-overlapping region of the PCA region may be contained in the non-light-emitting region.

In addition, the line region CLA is placed in a non-light-emitting region. However, when the light-emitting region EA partially overlaps the line region CLA, a portion of the region CLA overlapping the light-emitting region EA may act as a light-emitting region. A plurality of transmissive regions (TAij, where i is the row number, and j is the column number, i and j are natural numbers) may be arranged in matrix type.

The transparent display panel of FIG. 30 is one example having a sub-pixel arrangement structure of RG-BG, but the present disclosure is not limited thereto. For example, a first color sub-pixel may be a red sub-pixel including a first color light-emitting region emitting red light. A second color sub-pixel may be a green sub-pixel including a second color light-emitting region emitting green light. A third color sub-pixel may be a blue sub-pixel including a third color light-emitting region emitting blue light. However, the present disclosure is not limited thereto.

The first color sub-pixel Rij_SP includes a first color light-emitting region Rij and a first color pixel circuit region Rij_CA that is electrically connected to the first color light-emitting region Rij to control light emission from the first color light-emitting region Rij. The first color pixel circuit region Rij_CA may be disposed under the first color light-emitting region Rij while partially overlapping therewith. Thus, at least a partial region of the first color pixel circuit region Rij_CA does not overlap with the first color light-emitting region Rij, and thus may be exposed to an outside.

In this case, a portion of the first color pixel circuit region Rij_CA as exposed to the outside may be positionally biased relative to the first color light-emitting region Rij, for example, may be biased to a right side to the first color light-emitting region Rij. Thus, it is possible to more efficiently arrange the emitting region and the pixel circuit region in an entire pixel arrangement structure.

In the partial region of the first color pixel circuit region Rij_CA as exposed to the outside, a first color sub-pixel contact-hole Rij_H that electrically connects the first color light-emitting region Rij and the first color pixel circuit region Rij_CA to each other may be formed.

Further, each of the second color sub-pixel Gij_SP and the third color sub-pixel Bij_SP may be configured in the same manner as the first color sub-pixel Rij_SP as exemplified above in terms of the light-emitting region, the pixel circuit region, the sub-pixel contact-hole, etc. Thus, additional overlapping descriptions thereof will be omitted.

The first color sub-pixel is placed between adjacent rows of the transmissive regions. For example, first color sub-pixels R11_SP, R12_SP, and R13_SP are disposed between the transmissive regions TA11, TA12, and TA13 in the first row and the transmissive regions TA21, TA22, and TA23 in the second row, respectively. Thus, the first color light-emitting regions R11, R12, and R13 may be disposed between the transmissive regions TA11, TA12, and TA13 in the first row and the transmissive regions TA21, TA22, and TA23 in the second row, respectively.

The first color sub-pixel is disposed between the second color sub-pixel and the third color sub-pixel. Thus, the first color light-emitting region is disposed between the second color light-emitting region and the third color light-emitting region.

Further, the first color sub-pixel is disposed between adjacent line region CLAs among the plurality of line regions CLA arranged in the vertical direction of the substrate and does not overlap with the line regions CLA. The second color sub-pixel and the third color sub-pixel are disposed on the line region CLA and partially overlap the line region CLA.

For example, the second color sub-pixels G12_SP and G14_SP in the same row as the first color sub-pixels R11_SP, R12_SP, and R13_SP among the second color sub-pixels at least partially overlap the second column line region CLA2 and the fourth column line region CLA4, respectively. The second color sub-pixels G21_SP and G23_SP in the same row as the first color sub-pixels R21_SP, R22_SP, and R23_SP at least partially overlap the first column line region CLA1 and the third column line region CLA3, respectively.

The third color sub-pixels B11_SP and B13_SP in the same row as the first color sub-pixels R11_SP, R12_SP, and R13_SP among the third color sub-pixels at least partially overlap the first column line region CLA1 and the third column line region CLA3, respectively. The third color sub-pixels B22_SP and B24_SP in the same row as the first color sub-pixels R21_SP, R22_SP, and R23_SP at least partially overlap the second column line region CLA2 and the fourth column line region CLA4, respectively.

In other words, as in a configuration in which the second color sub-pixel B11_SP and the third color sub-pixel G21_SP are spaced apart in the column direction and disposed on the first column line region CLA1. The second color sub-pixel and the third color sub-pixel are disposed on one column line region and are alternately arranged in the column direction.

Further, as in a configuration in which the second color sub-pixel B11_SP and the third color sub-pixel G12_SP in the same row are disposed on the first column line region CLA1 and the second column line region CLA2 adjacent thereto respectively, the second color sub-pixel and the third color sub-pixel are alternately arranged in the row direction and are disposed on column line regions adjacent to each other in the row direction respectively.

Therefore, the first color sub-pixel R11_SP, the second color sub-pixel G12_SP, the first color sub-pixel R12_SP, and the third color sub-pixel B13_SP are sequentially arranged in the first row. In the second row adjacent to the first row, the first color sub-pixel R21_SP, the third color sub-pixel B22_SP, the first color sub-pixel R22_SP, and the second color sub-pixel G23_SP are sequentially arranged to correspond to the above pattern.

Therefore, the second color sub-pixel G12_SP, the first color sub-pixel R12_SP, and the third color sub-pixel B13_SP consecutively arranged in the first row, and the third color sub-pixel B22_SP, the first color sub-pixel R22_SP, and the second color sub-pixel G23_SP arranged in the second row surround the transmissive region TA22. When using this arrangement shape as a basic unit, a plurality of units are arranged in a matrix manner in the display region.

That is, in the transmissive region according to an embodiment of the present disclosure, when the above-described basic unit is defined as one pixel, a single transmissive region is not divided into two or more in a single pixel, thereby to effectively suppress increase in the haze.

Figure 31A:
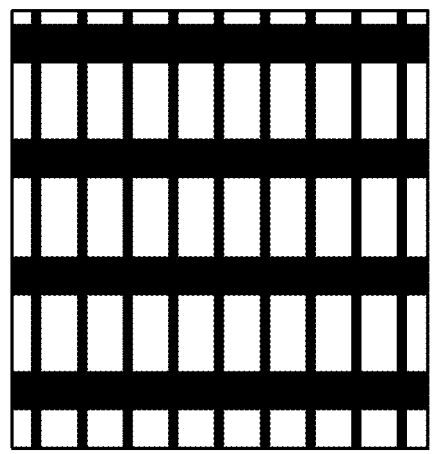
FIG. 31A to FIG. 31C show haze value measurements based on transmissive region shape.
Figure 31B:
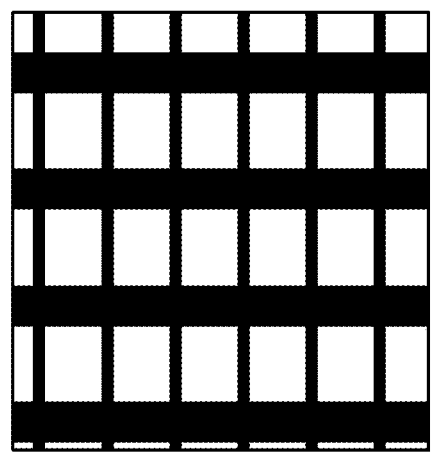
Figure 31C:
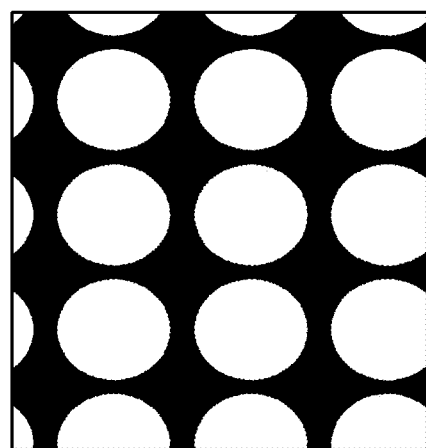
Figure 32:
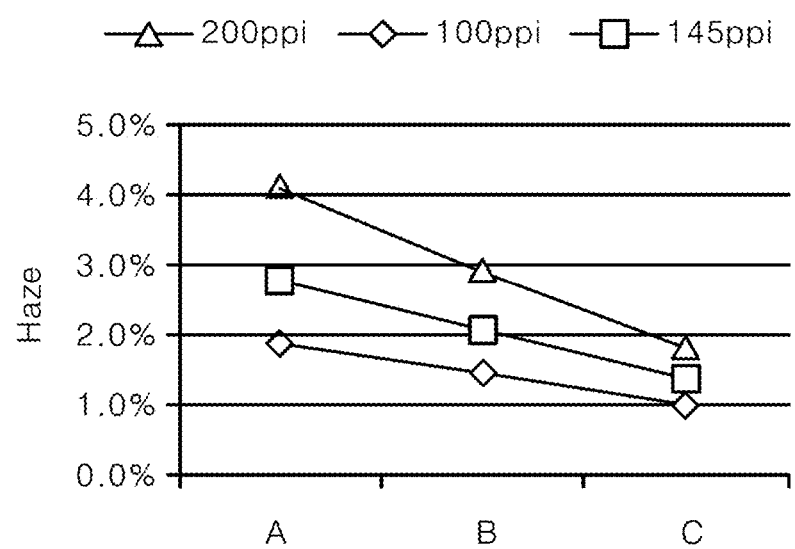
FIG. 32 shows haze value measurements based on transmissive region shapes and based on different ppi.

In this regard, the variation in the haze value based on the shape of the transmissive region and based on the division or non-division of the transmissive region may be identified based on FIG. 31 and FIG. 32. Specifically, FIG. 31A shows a configuration in which the transmissive region has a quadrangle shape, and three transmissive regions correspond to one pixel. FIG. 31B shows a configuration in which the transmissive region has a quadrangle shape, and two transmissive regions correspond to one pixel. FIG. 31C shows a configuration in which one transmissive region corresponds to one pixel while the transmissive region has a circular shape as in one embodiment of the present disclosure.

All of FIG. 31A to FIG. 31C are experiment results based on 145 ppi (pixels per inch). In FIG. 31A, a haze value of 2.76% was measured. In FIG. 31B, a haze value of 2.03% was measured. Therefore, it may be seen that the haze value decreases by 26.4% as the number of transmissive regions corresponding to one pixel decreases from three to two.

In FIG. 31C, a haze value of 1.33% was measured. Therefore, in FIG. 31C, the haze value decreased by 34.5% compared to that of FIG. 31B. Thus, it may be clearly seen that as the number of transmissive regions decreased from 2 to 1, and the transmissive region has the circular shape, the haze value further decreases.

FIG. 32 shows a graph of the haze value when ppi is 200 ppi, 100 ppi, and 145 ppi respectively, and when the transmissive region has a quadrangle shape, and the number of transmissive regions corresponding to one pixel is 3 (A), when the transmissive region has a quadrangle shape, and the number of transmissive regions corresponding to one pixel is 2 (B), and when a circular transmissive region is provided, and the number of transmissive regions corresponding to one pixel is 1 (C).

As may be seen from the graph result value in FIG. 32 that in the configuration C in which a circular transmissive region is disposed, but the number of transmissive regions corresponding to one pixel is 1, the haze value is reduced or minimized for all ppi.

The first color light-emitting region, the second color light-emitting region and the third color light-emitting region are arranged to correspond to the first color sub-pixel, the second color sub-pixel and the third color sub-pixel, respectively. Thus, the light-emitting regions are arranged in the same manner as the arrangement structure of the sub-pixels as illustrated above.

Figure 34:
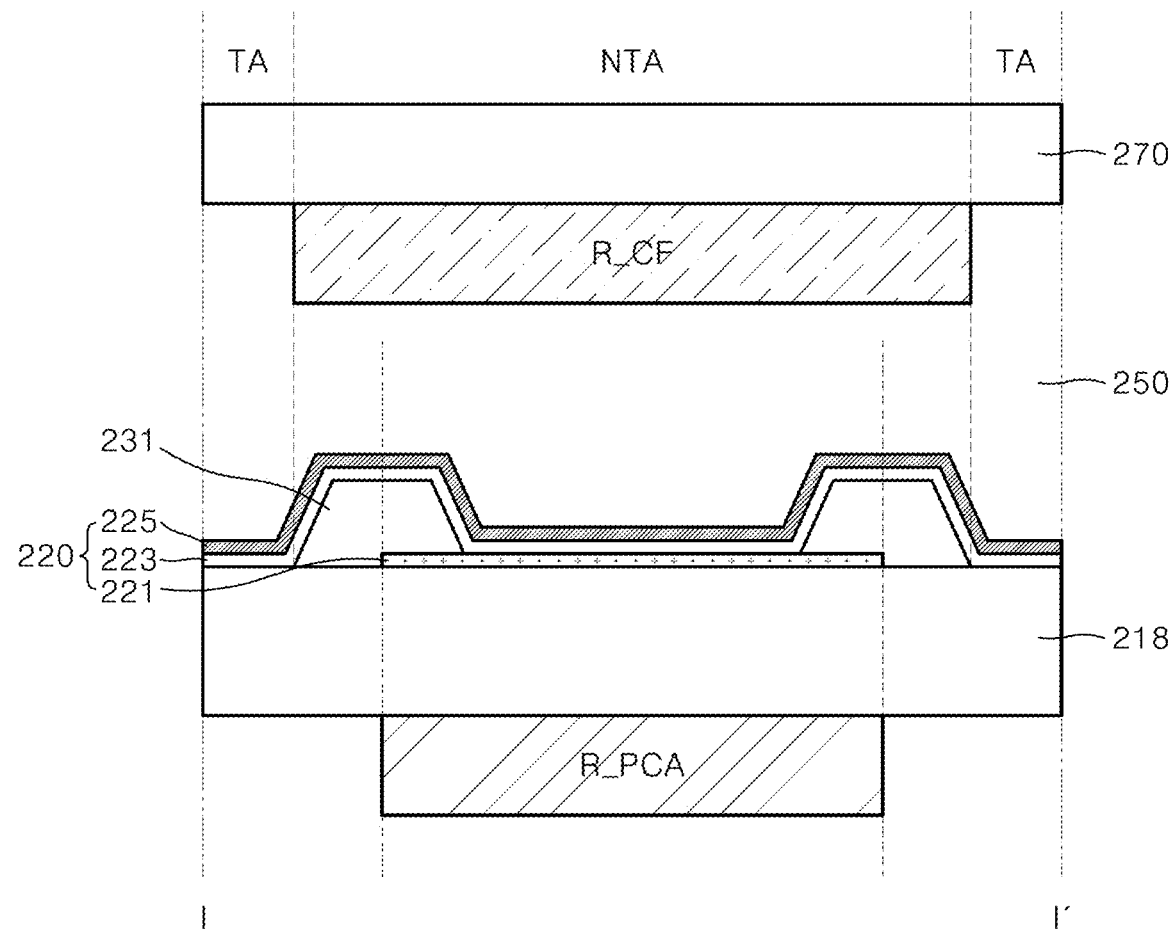
FIG. 34 and FIG. 35 show cross-sections of a I-I' region and a J-J' region in FIG. 30, respectively.

As shown in FIG. 30, the transmissive region has an octagonal shape. The first color light-emitting region has a rectangular shape. In this case, the shape of the first color light-emitting region is formed so as be surrounded by the bank layer 231 as shown in FIG. 34. Specifically, in the first color light-emitting region, the bank layer 231 may be removed to be opened.

Further, each of the second color light-emitting region and the third color light-emitting region may have a polygonal shape, for example, a hexagon. A shape of each of the second color light-emitting region and the third color light-emitting region is formed so as be surrounded by the bank layer 231. Specifically, in each of the second and third color light-emitting regions, the bank layer 231 may be removed to be opened.

An area of one first color light-emitting region may be smaller than an area of each of one second color light-emitting region and one third color light-emitting region. Specifically, since the red light-emitting region has a longer lifespan than that of each of the green and blue light-emitting regions, the former has better lifespan reliability and light-emitting efficiency. Therefore, it is desirable to form the red light-emitting region to have a smaller area than that of each of the green and blue light-emitting regions. For example, the first color light-emitting region, the second color light-emitting region, and the third color light-emitting region may be formed at an area ratio of approximately 1:1.8:1.8.

Each of the second color light-emitting region and the third color light-emitting region may be disposed on the corresponding line region and may at least partially overlap therewith. In this case, each of the second color light-emitting region and the third color light-emitting region may be arranged to be symmetrical around each corresponding line region. Due to this arrangement structure, the transparent display panel according to an embodiment of the present disclosure may have a pixel arrangement structure that may make the most of a light-emitting area efficiently.

Figure 33:
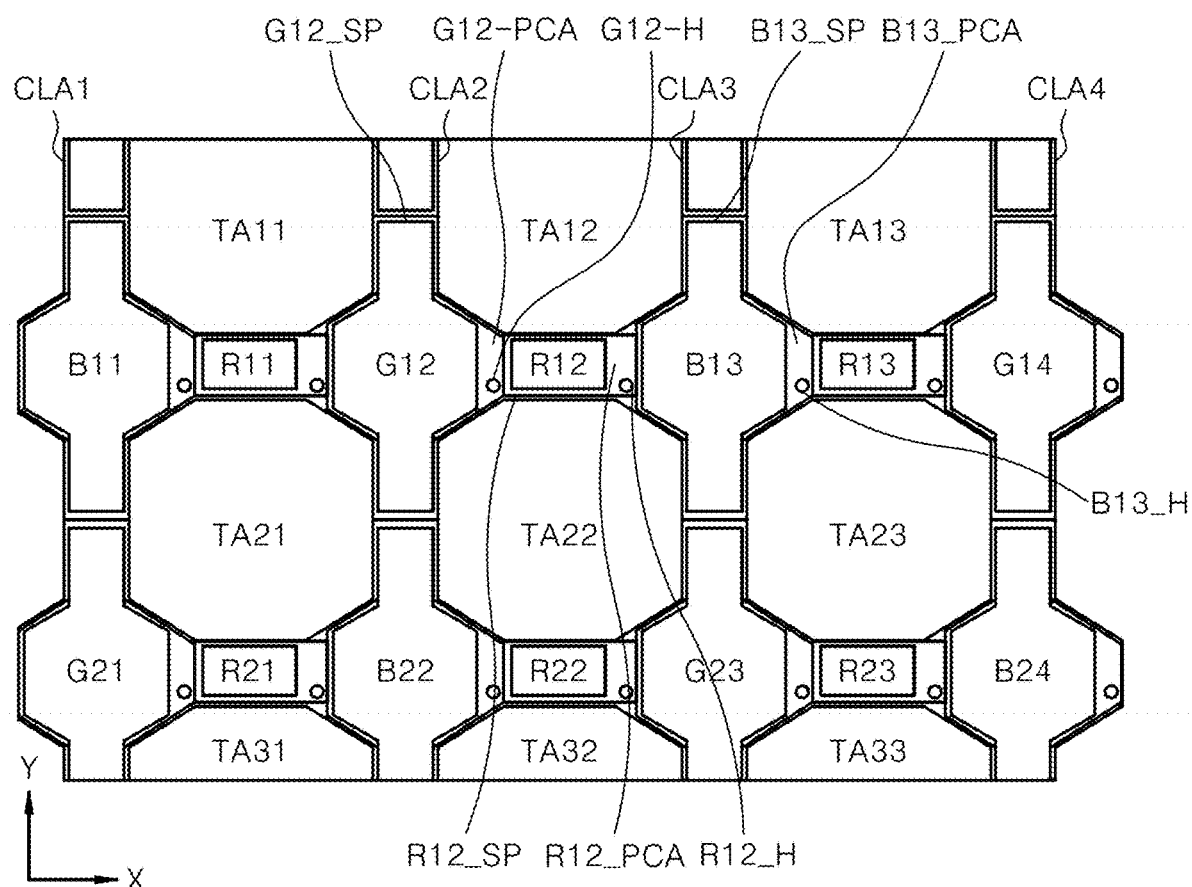
FIG. 33 shows a configuration in which transmissive regions and light-emitting regions of a transparent display device according to another embodiment of the present disclosure are arranged.

In another embodiment of the present disclosure, as shown in FIG. 33, each of the second color sub-pixel and the third color sub-pixel may include a light-emitting region further extending along the line region in the column direction of the line region.

In order to secure the light-emitting region as much as possible, as shown in FIG. 33, for example, the third color sub-pixel B11_SP and the second color sub-pixel G21_SP arranged in the column direction of the first line region CLA1 expand such that a spacing therebetween is larger.

Preferably, the third color sub-pixel B11_SP and the second color sub-pixel G21_SP arranged in the column direction of the first line region CLA1 may be further extended to an extent such that distal ends of the two sub-pixels abut each other. However, the distal ends thereof may have a predefined separation space therebetween considering a process margin.

In particular, when the second electrode of the organic light-emitting diode, for example, the cathode electrode is made of a metal such as Ag having a low sheet resistance, a separate contact structure is not required to lower the resistance of the cathode electrode. Thus, as shown in FIG. 33, the area of each of the color sub-pixels may be expanded as much as possible on the line region.

Figure 35:
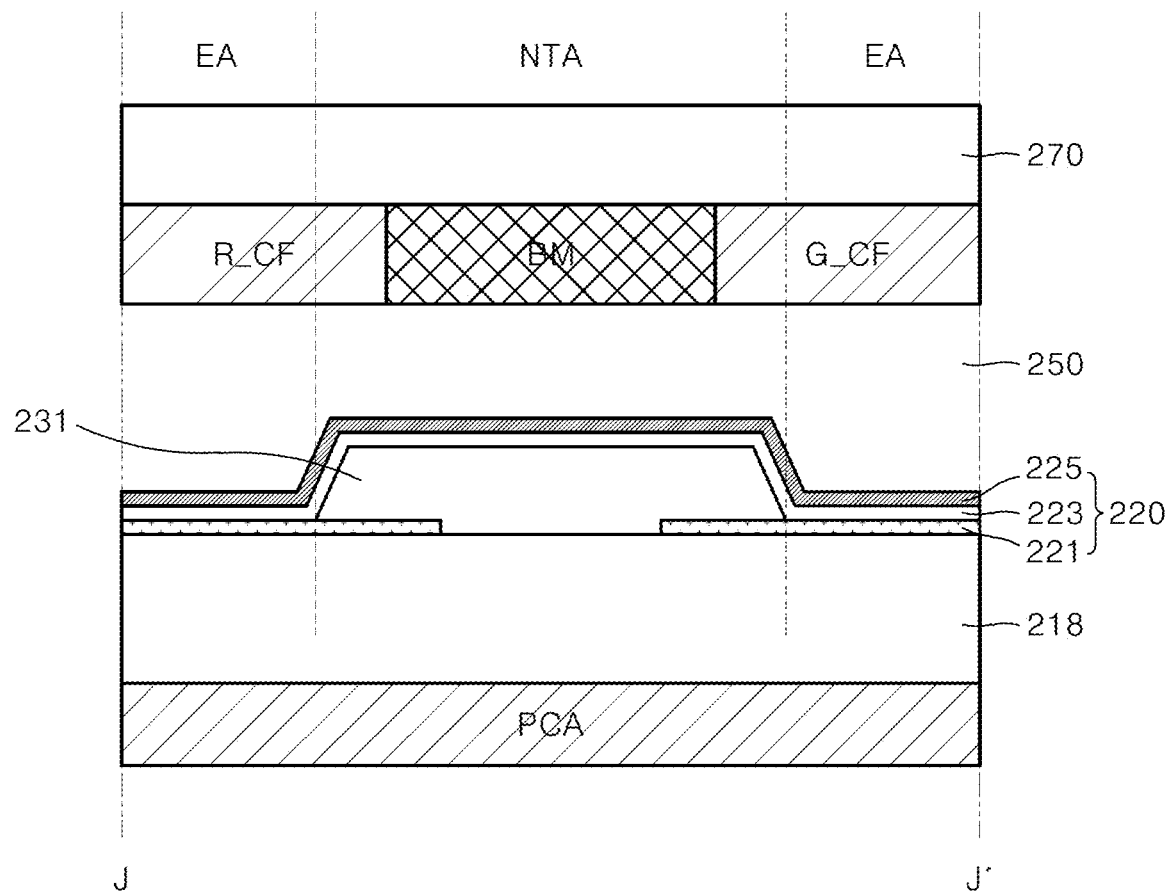

FIG. 34 and FIG. 35 show cross-sections of a I-I' region and a J-J' region in FIG. 30, respectively. FIG. 34 is a cross-sectional view of a first color sub-pixel region.

Specifically, the passivation layer 218 as a planarization layer is disposed on the first color pixel circuit region R_PCA. The first electrode 221 of the organic light-emitting diode 220, for example, an anode electrode, is formed on the passivation layer 218.

The bank layer 231 is formed on the first electrode 221. In order to expose a portion of the first electrode 221 corresponding to the light-emitting region to the outside, a portion of the bank layer 231 corresponding to the light-emitting region is removed and thus the bank layer is patterned. That is, the bank layer 231 may serve as a boundary that defines the light-emitting region, thereby determining a shape of the light-emitting region, and may also serve as a boundary between the sub-pixel and the transmissive region.

The shape of the first electrode 221 is determined based on the shape into which the bank layer 231 is patterned. In order to increase or maximize the transmittance and the light-emitting region, it is desirable to form the bank layer to have a minimum width allowable in a mask process for forming the bank layer 231.

On and over the first electrode 221, the organic light-emitting layer 223 is formed to cover the bank layer 231. The second electrode 225, for example, a cathode electrode, is formed on the organic light-emitting layer 223. As the organic light-emitting layer 223 and the second electrode 225 are stacked on the first electrode 221 in an overlapping manner to form the organic light-emitting diode 220, a region of the first electrode 221 exposed to an outside through an open region in the bank layer 231 may act as the light-emitting region.

The encapsulating layer 250 may be formed on the second electrode 225. A color filter CF may be formed on the encapsulating layer 250. The color filter CF may have the same color as a corresponding light-emitting region. A first color filter R_CF corresponding to the first color sub-pixel R_SP may have the same color as the first color.

When using the color filter CF, it is possible to reduce reflectance and increase the color purity of RGB color. The color filter CF may extend to a boundary between the transmissive region TA and the light-emitting region EA and thus may be formed in the non-transmissive region NTA. Therefore, a region where the color filter CF is formed may be defined as the light-emitting region.

The top substrate as the second substrate 270 may be adhered onto the color filter CF. Further, to prevent damage to the organic film layer which is vulnerable to high temperatures, the top substrate may be disposed on the color filter CF using a COE (color-filter on encap) approach in which a low-temperature color filter process is performed on the substrate without a bonding process.

In one example, FIG. 35 is a cross-sectional view of a border region between the first color sub-pixel R_SP and the second color sub-pixel G_SP.

The passivation layer 218 as the planarization layer is disposed on the pixel circuit region PCA, specifically, the first color pixel circuit region R_PCA and the second color pixel circuit region G_PCA. The first electrode 221 of the organic light-emitting diode 220, for example, an anode electrode is formed on the passivation layer 218.

The first electrodes 221 spaced apart from each other are respectively formed in the first color sub-pixel region and the second color sub-pixel region. The bank layer 231 is formed on the first electrode 221. In order to expose a portion of the first electrode 221 corresponding to the light-emitting region to the outside, a portion of the bank layer 231 corresponding to the light-emitting region is removed and then the bank layer is patterned.

That is, the bank layer 231 may serve as a boundary between sub-pixels adjacent to each other. The region corresponding to the bank layer 231 may be a non-transmissive region NTA. On and over the first electrode 221, the organic light-emitting layer 223 is formed to cover the bank layer 231. The second electrode 225 is formed on the organic light-emitting layer 223.

As the organic light-emitting layer 223 and the second electrode 225 are stacked on the first electrode 221 in an overlapping manner to form the organic light-emitting diode 220, the region of the first electrode 221 exposed to the outside through the open region of the bank layer 231 may be a light-emitting region.

The encapsulating layer 250 may be formed on the second electrode 225. The color filter CF may be formed on the encapsulating layer 250.

The first color filter R_CF corresponding to the first color sub-pixel R_SP may have the first color. The second color filter G_CF corresponding to the second color sub-pixel G_SP may have the second color.

Both of the first color filter R_CF and the second color filter G_CF may be formed to be as wide as possible so that at least a partial region thereof overlaps the bank layer 231.

In one example, the first color sub-pixel R_SP and the second color sub-pixel G_SP are adjacent to each other. Thus, in order to reduce or minimize mixing of light beams of different colors adjacent to each other and to clarify a boundary between different color light-emitting regions, a non-transparent black matrix may be disposed between the first color filter R_CF and the second color filter G_CF.

The black matrix may be formed in a pattern corresponding to the bank layer 231 forming the boundary, and may be formed to be narrower than the bank layer 231 and may be disposed inside the bank layer 231.

Figure 36:
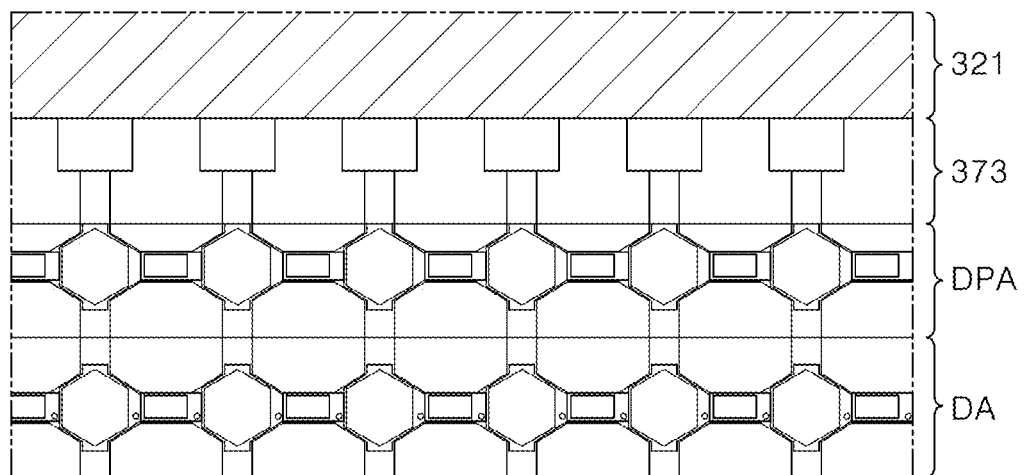
FIG. 36 and FIG. 37 show a dummy pixel pattern region surrounding the outermost portion of a display region.

In one example, as shown in FIG. 36, the substrate has a non-display region surrounding the display region. The non-display region may include a dummy pixel pattern region DPA arranged to surround the outermost portion of the display region DA. Specifically, the display region DA includes a plurality of sub-pixels SP. The dummy pixel pattern region DPA may include a plurality of dummy pixels or dummy sub-pixels DSP (see FIG. 37).

The dummy pixel DSP or dummy sub-pixels is formed to reduce or minimize a process deviation and a side effect such as a loading effect that may occur during a manufacturing process of the transparent display device. The dummy pixel DSP may surround the sub-pixel to serve as a kind of a buffer area.

The dummy pixel DSP may have an organic light-emitting element layer and a circuit region such as a driving thin-film transistor as in the sub-pixel. However, a signal is not applied to each element layer and the circuit region of the dummy pixel. Thus, a separate pixel contact-hole SP_H that electrically connect the components thereof to each other is not required. As a result, the organic light-emitting element layer in the dummy pixel pattern region DPA does not emit light. For example, the circuit region such as the driving thin-film transistor of the dummy pixel may not work or operate to emit light.

Figure 37:
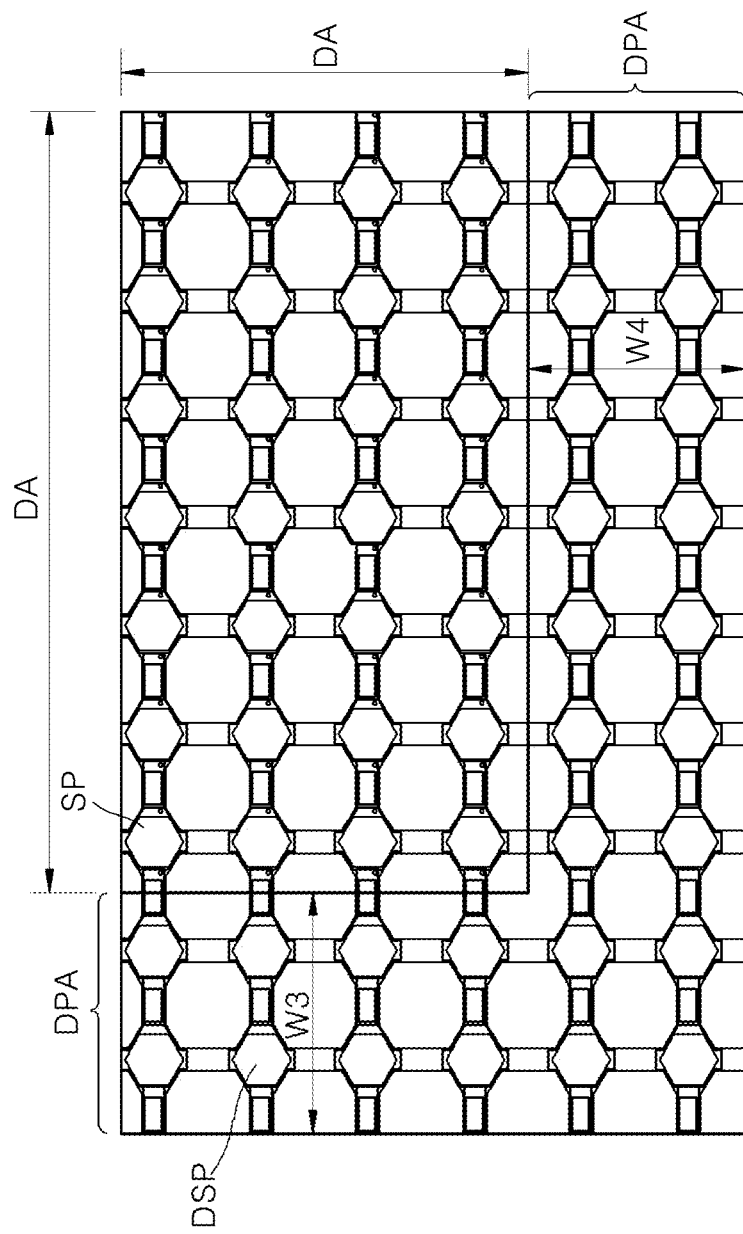

The dummy pixel pattern region DPA surrounding the outermost portion of the display region DA may include a top row direction region and a bottom row direction region above and below the display region DA, as shown in FIG. 37. The dummy pixel pattern region DPA surrounding the outermost portion of the display region DA may include a left column direction region and a right column direction region left and right to the display region DA as shown in FIG. 37. The static electricity may invade the GIP regions left and right to the display region DA through the gate line. Thus, a left column direction region and a right column direction region of the dummy pixel pattern region DPA may be thicker than a top row direction region and a bottom row direction region thereof. For example, as shown in FIG. 37, the left column direction region may have a width $W_3$ and the bottom row direction region may have a width $W_4$. In some embodiments, width $W_3$ may be thicker than width $W_4$. However, other dimensions may be used in other embodiments according to the display design.

A first aspect of the present disclosure provides a transparent display panel comprising: a substrate having a display region including a plurality of light-emitting regions and a plurality of transmissive regions; and a plurality of line regions disposed over the substrate and extending across the display region, wherein an outer contour of each of the transmissive regions is at least partially curved.

In one implementation of the first aspect, the outer contour has a circular shape.

In one implementation of the first aspect, the plurality of light-emitting regions include a first color light-emitting region, a second color light-emitting region, and a third color light-emitting region, wherein the second color light-emitting region and the third color light-emitting region are disposed on corresponding line regions respectively, wherein the first color light-emitting region is disposed between the second color light-emitting region and the third color light-emitting region.

In one implementation of the first aspect, the first color light-emitting region is disposed between line regions adjacent to each other.

In one implementation of the first aspect, an area of the first color light-emitting region is smaller than an area of each of the second color light-emitting region and the third color light-emitting region.

In one implementation of the first aspect, the first color light-emitting region emits red light, wherein the second color light-emitting region emits green light, wherein the third color light-emitting region emits blue light.

In one implementation of the first aspect, each of the second color light-emitting region and the third color light-emitting region is arranged to be symmetrical around each corresponding line region.

In one implementation of the first aspect, each of the line regions extends in a vertical direction of the substrate.

In one implementation of the first aspect, the transmissive regions are arranged in a matrix manner, the first color light-emitting regions are arranged in a matrix manner, the second color light-emitting regions are arranged in a matrix manner, and the third color light-emitting region are arranged in a matrix manner.

In one implementation of the first aspect, the substrate includes a non-display region surrounding the display region, wherein the non-display region includes a dummy pixel pattern region surrounding an outer periphery of the display region.

In one implementation of the first aspect, the dummy pixel pattern region has left and right regions thereof to the display region thicker than upper and lower regions thereof above and below the display region.

A second aspect of the present disclosure provides a transparent display panel comprising: a substrate having a display region including a plurality of light-emitting regions and a plurality of transmissive regions; and a plurality of line regions disposed over the substrate and extending across the display region, wherein each of the transmissive regions has a polygonal shape, wherein all internal angles of the polygon shape are obtuse.

In one implementation of the second aspect, the plurality of light-emitting regions include a first color light-emitting region, a second color light-emitting region, and a third color light-emitting region, wherein the second color light-emitting region and the third color light-emitting region are disposed on corresponding line regions respectively, wherein the first color light-emitting region is disposed between the second color light-emitting region and the third color light-emitting region.

In one implementation of the second aspect, the first color light-emitting region is disposed between line regions adjacent to each other.

In one implementation of the second aspect, an area of the first color light-emitting region is smaller than an area of each of the second color light-emitting region and the third color light-emitting region.

In one implementation of the second aspect, the first color light-emitting region emits red light, wherein the second color light-emitting region emits green light, wherein the third color light-emitting region emits blue light.

In one implementation of the second aspect, the first color light-emitting region has a rectangular shape.

In one implementation of the second aspect, each of the second color light-emitting region and the third color light-emitting region is arranged to be symmetrical around each corresponding line region.

In one implementation of the second aspect, each of the second color light-emitting region and the third color light-emitting region has a polygonal shape.

In one implementation of the second aspect, each of the second color light-emitting region and the third color light-emitting region corresponds to an open region defined in the bank layer.

In one implementation of the second aspect, each of the line regions extends in a vertical direction of the substrate.

In one implementation of the second aspect, the transmissive regions are arranged in a matrix manner, the first color light-emitting regions are arranged in a matrix manner, the second color light-emitting regions are arranged in a matrix manner, and the third color light-emitting region are arranged in a matrix manner.

In one implementation of the second aspect, the substrate includes a non-display region surrounding the display region, wherein the non-display region includes a dummy pixel pattern region surrounding an outer periphery of the display region.

In one implementation of the second aspect, the dummy pixel pattern region has left and right regions thereof to the display region thicker than upper and lower regions thereof above and below the display region.

A third aspect of the present disclosure provides a transparent display device including the transparent display panel as defined above, a data driver supplying a data voltage to the transparent display panel, a gate driver supplying a scan signal to the transparent display panel, and a timing controller that controls the gate driver and the data driver.

As described above, the present disclosure is described with reference to the drawings. However, the present disclosure is not limited by the embodiments and drawings disclosed in the present specification. It will be apparent that various modifications may be made thereto by those skilled in the art within the scope of the present disclosure. Furthermore, although the effect resulting from the features of the present disclosure has not been explicitly described in the description of the embodiments of the present disclosure, it is obvious that a predictable effect resulting from the features of the present disclosure should be recognized.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a transparent display panel including:
a substrate having a display region including a plurality of light-emitting regions and a plurality of transmissive regions; and
a plurality of line regions disposed over the substrate and extending across the display region, the plurality of line regions including a plurality of first line regions extending in a first direction and a plurality of second line regions extending in a second direction transverse to the first direction,
wherein each of the transmissive regions has a polygonal shape, wherein all internal angles of the polygon shape are obtuse,
wherein one transmissive region is disposed adjacent to a plurality of light-emitting regions including at least four light-emitting regions including obtuse internal angles and at least two light-emitting regions including right internal angles,
wherein the at least two light-emitting regions including right internal angles are red sub-pixels,
wherein the plurality of first line regions overlaps with both a blue sub-pixel and a green sub-pixel and does not overlap with a red sub-pixel from a plan view, and
wherein the green sub-pixel is larger than the red sub-pixel.

2. The display device of claim 1, wherein the plurality of light-emitting regions includes a first color light-emitting region, a second color light-emitting region, and a third color light-emitting region,
wherein the second color light-emitting region and the third color light-emitting region are disposed over corresponding line regions respectively,
wherein the first color light-emitting region is disposed between the second color light-emitting region and the third color light-emitting region, and
wherein the first color light-emitting region is disposed between line regions adjacent to each other, the first color light-emitting region including a light-emitting region of a red sub-pixel.

3. The display device of claim 2, wherein an area of the first color light-emitting region is smaller than an area of each of the second color light-emitting region and the third color light-emitting region.

4. The display device of claim 2, wherein the first color light-emitting region emits red light, wherein the second color light-emitting region emits green light, wherein the third color light-emitting region emits blue light.

5. The display device of claim 2, wherein the first color light-emitting region has a rectangular shape.

6. The display device of claim 2, wherein each of the second color light-emitting region and the third color light-emitting region is arranged to be symmetrical around each corresponding line region.

7. The display device of claim 2, wherein each of the second color light-emitting region and the third color light-emitting region has a polygonal shape.

8. The display device of claim 2, wherein each of the second color light-emitting region and the third color light-emitting region corresponds to an open region defined in a bank layer.

9. The display device of claim 1, wherein the substrate has a horizontal direction and a vertical direction, wherein each of the line regions extends in the vertical direction of the substrate.

10. The display device of claim 1, wherein the transmissive regions are arranged in a matrix manner, the first color light-emitting regions are arranged in a matrix manner, the second color light-emitting regions are arranged in a matrix manner, and the third color light-emitting region are arranged in a matrix manner.

11. The display device of claim 1,
wherein the substrate includes a non-display region surrounding the display region, the non-display region including a dummy pixel pattern region, and
wherein the dummy pixel pattern region has left and right regions thereof to the display region thicker than upper and lower regions thereof above and below the display region.

12. A display device, comprising:
a transparent display panel including:
a substrate having a display region including a plurality of light-emitting regions and a plurality of transmissive regions, the plurality of light-emitting regions including a red sub-pixel, a green sub-pixel, and a blue sub-pixel; and
a plurality of line regions disposed over the substrate and extending across the display region, the plurality of line regions including a plurality of first line regions extending in a first direction and a plurality of second line regions extending in a second direction transverse to the first direction,
wherein one transmissive region is disposed adjacent to a plurality of light-emitting regions including at least four light-emitting regions including obtuse internal angles and at least two light-emitting regions including right internal angles,
wherein an area of a red sub-pixel is smaller than an area of one of a blue sub-pixel or a green sub-pixel,
wherein the plurality of first line regions is spaced apart from the red sub-pixel and does not overlap with the red sub-pixel from a plan view, and
wherein an area of the green sub-pixel is larger than an area of the red sub-pixel.

13. A display device, comprising:
a transparent display panel including:
a substrate having a display region including a plurality of light-emitting regions and a plurality of transmissive regions; and
a plurality of line regions disposed over the substrate and extending across the display region,
wherein each of the transmissive regions has a polygonal shape, wherein all internal angles of the polygon shape are obtuse,
wherein one transmissive region is disposed adjacent to a plurality of light-emitting regions including at least four light-emitting regions including obtuse internal angles and at least two light-emitting regions including right internal angles,
wherein the plurality of line regions includes a plurality of first line regions extending in a first direction and a plurality of second line regions extending in a second direction transverse to the first direction,
wherein the at least two light-emitting regions including right internal angles are disposed in an area between adjacent first line regions of the plurality of first line regions,
wherein the plurality of first line regions overlaps with both a blue sub-pixel and a green sub-pixel, and
wherein a light-emitting region of the green sub-pixel is larger than a light-emitting region of a red sub-pixel.

14. The display device of claim 13, wherein the plurality of first line regions do not overlap with a red sub-pixel.

15. The display device of claim 13, wherein the plurality of second line regions overlap with a blue sub-pixel, a red sub-pixel, and a green sub-pixel.

* * * * *